(12) United States Patent
Takayama et al.

(10) Patent No.: US 7,145,241 B2
(45) Date of Patent: Dec. 5, 2006

(54) SEMICONDUCTOR DEVICE HAVING A MULTILAYER INTERCONNECTION STRUCTURE AND FABRICATION PROCESS THEREOF

(75) Inventors: Toshio Takayama, Kawasaki (JP);
Kuniyuki Narukawa, Kasugai (JP);
Hiroshi Mizutani, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/735,886

(22) Filed: Dec. 16, 2003

(65) Prior Publication Data
US 2004/0124537 A1 Jul. 1, 2004

(30) Foreign Application Priority Data
Dec. 20, 2002 (JP) .............................. 2002-371134

(51) Int. Cl.
*H01L 23/48* (2006.01)
*H01L 23/52* (2006.01)
*H01L 29/40* (2006.01)

(52) U.S. Cl. ...................... 257/758; 257/774; 257/767; 257/761; 257/762; 257/763

(58) Field of Classification Search ................ 257/774, 257/758, 761–764, 753
See application file for complete search history.

(56) References Cited

U.S. PATENT DOCUMENTS 6,037,664 A * 3/2000 Zhao et al. ................. 257/758
6,306,732 B1 * 10/2001 Brown ........................ 438/468
6,359,328 B1 * 3/2002 Dubin ......................... 257/622
6,372,633 B1 4/2002 Maydan et al. ............. 438/637
6,500,675 B1 * 12/2002 Takata et al. .................. 438/3

FOREIGN PATENT DOCUMENTS

| CN | 1131817 A | 9/1996 |
| CN | 1359536 A | 7/2002 |
| EP | 0724292 | 7/1996 |
| JP | 06-287741 | 11/1994 |
| JP | 7-94610 | 4/1995 |
| JP | 11-8753 | 1/1999 |
| JP | 2001-93976 | 4/2001 |

* cited by examiner

*Primary Examiner*—Nitin Parekh
(74) *Attorney, Agent, or Firm*—Armstrong, Kratz, Quintos, Hanson & Brooks, LLP.

(57) ABSTRACT

A multilayer interconnection structure includes a first interconnection layer having a copper interconnection pattern and a second interconnection layer having an aluminum interconnection layer and formed on the first interconnection layer via an intervening interlayer insulation film, wherein a tungsten plug is formed in a via-hole formed in the interlayer insulation film so as to connect the first interconnection layer and the second interconnection layer electrically. The via-hole has a depth/diameter ratio of 1.25 or more, and there is formed a conductive nitride film between the outer wall of the tungsten plug and an inner wall of the via-hole such that the entirety of the conductive nitride film is formed of a conductive nitride.

5 Claims, 28 Drawing Sheets

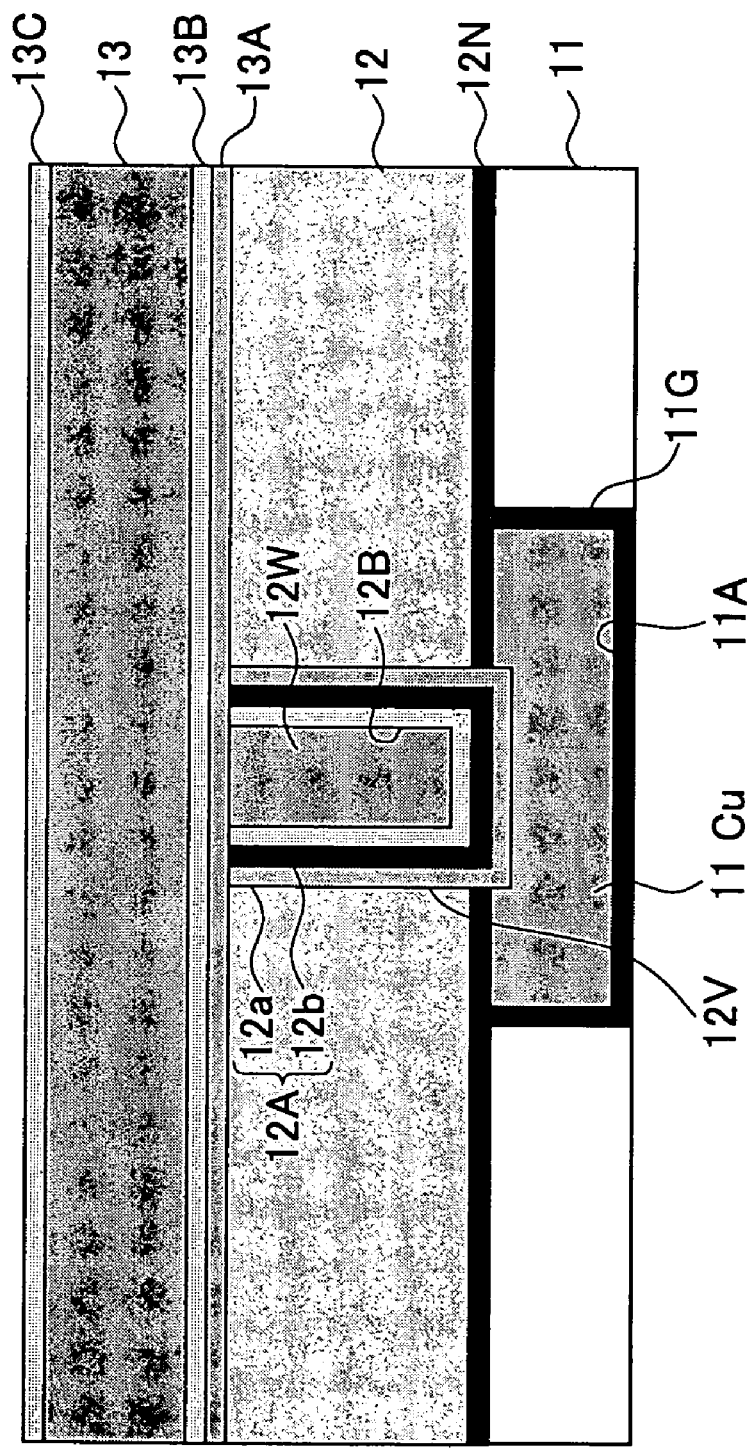

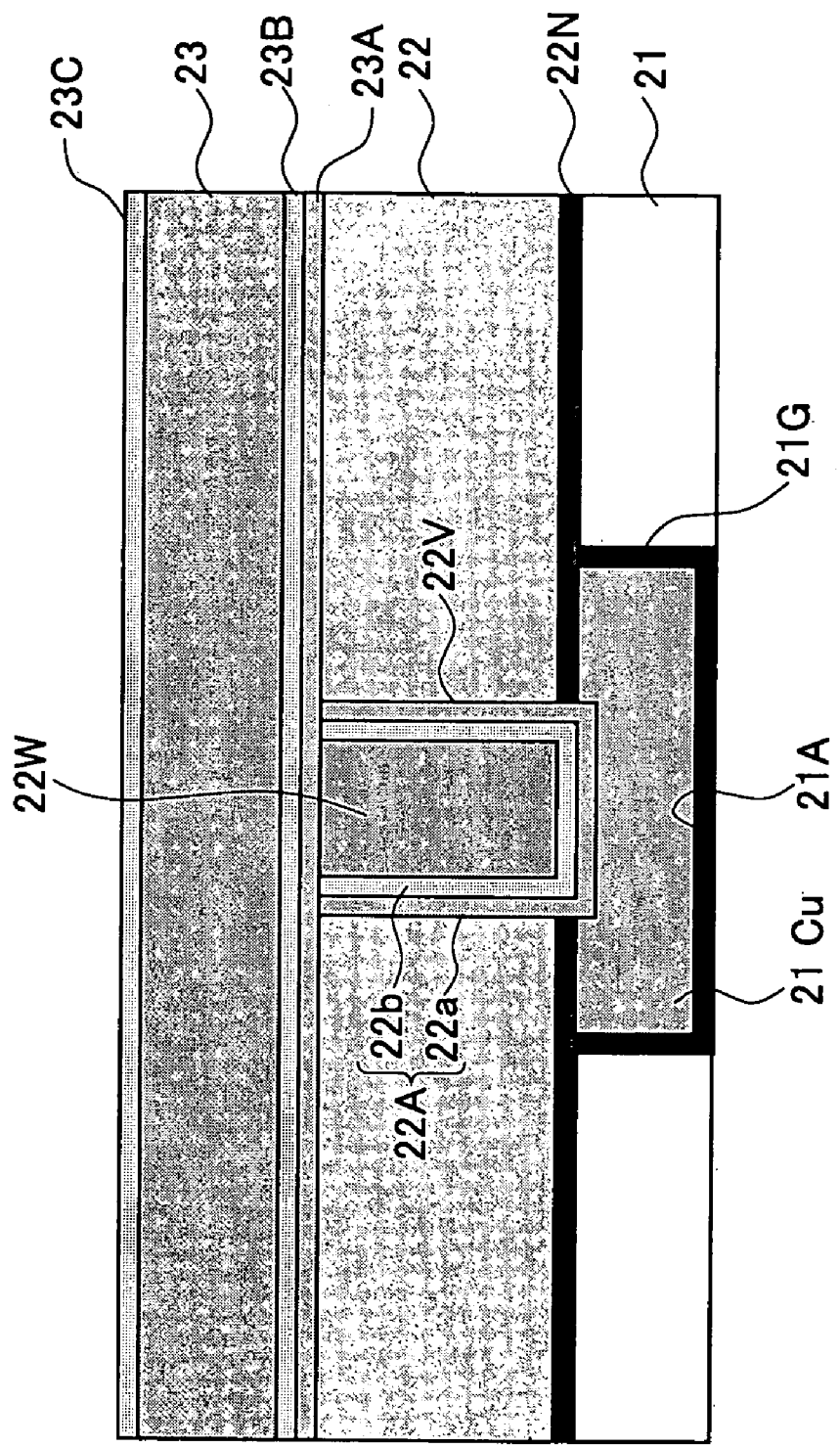

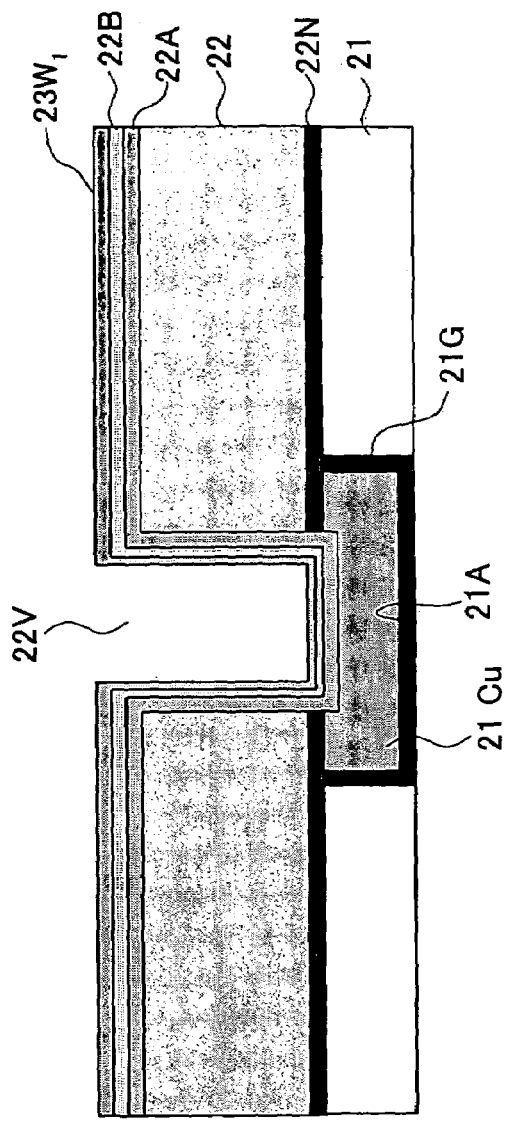
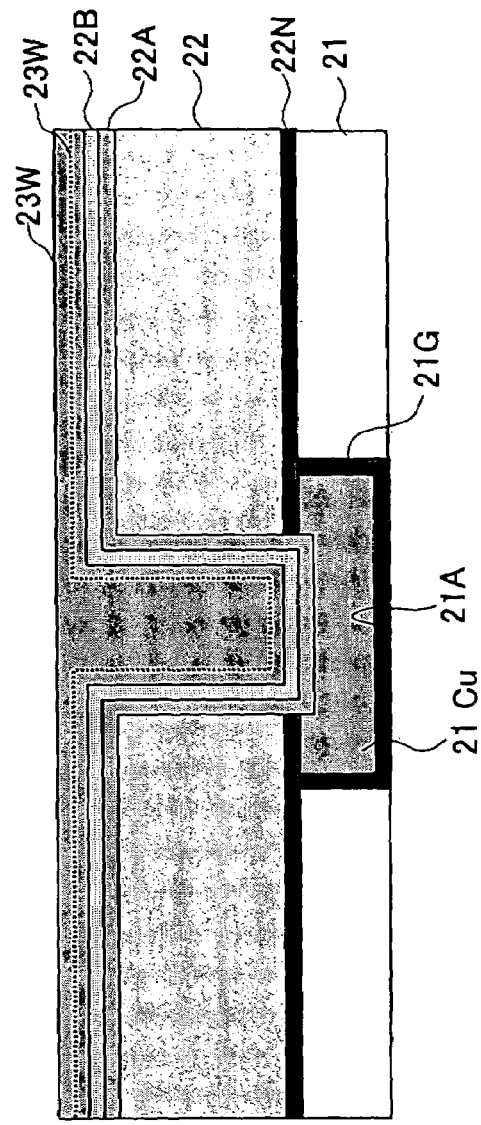
FIG.10A
FIG.10B

PARGE

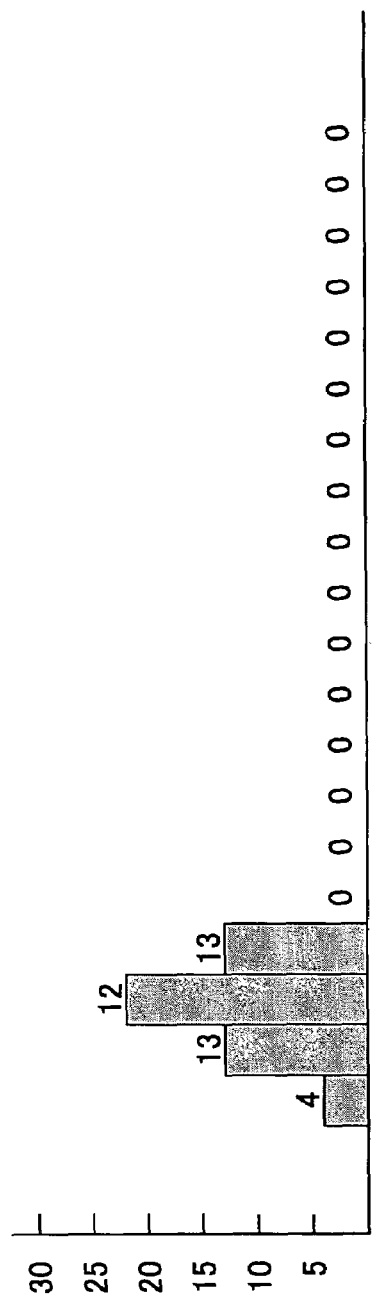
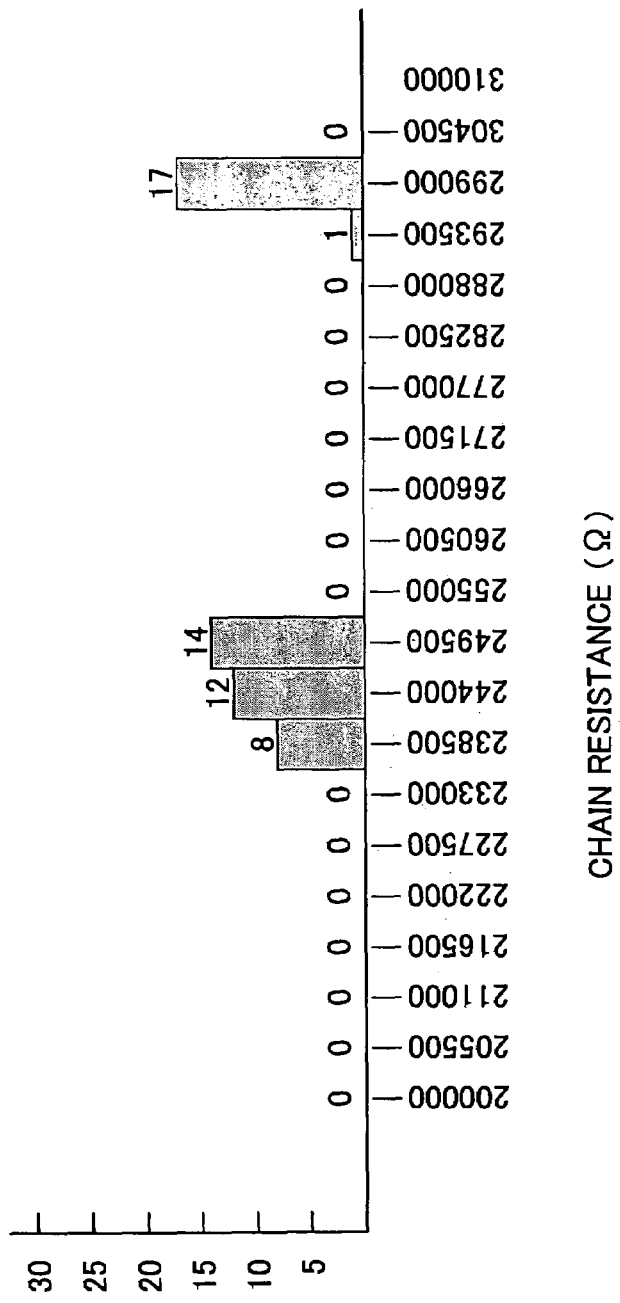
FIG.13A PRESENT INVENTION
FIG.13B CONVENTIONAL

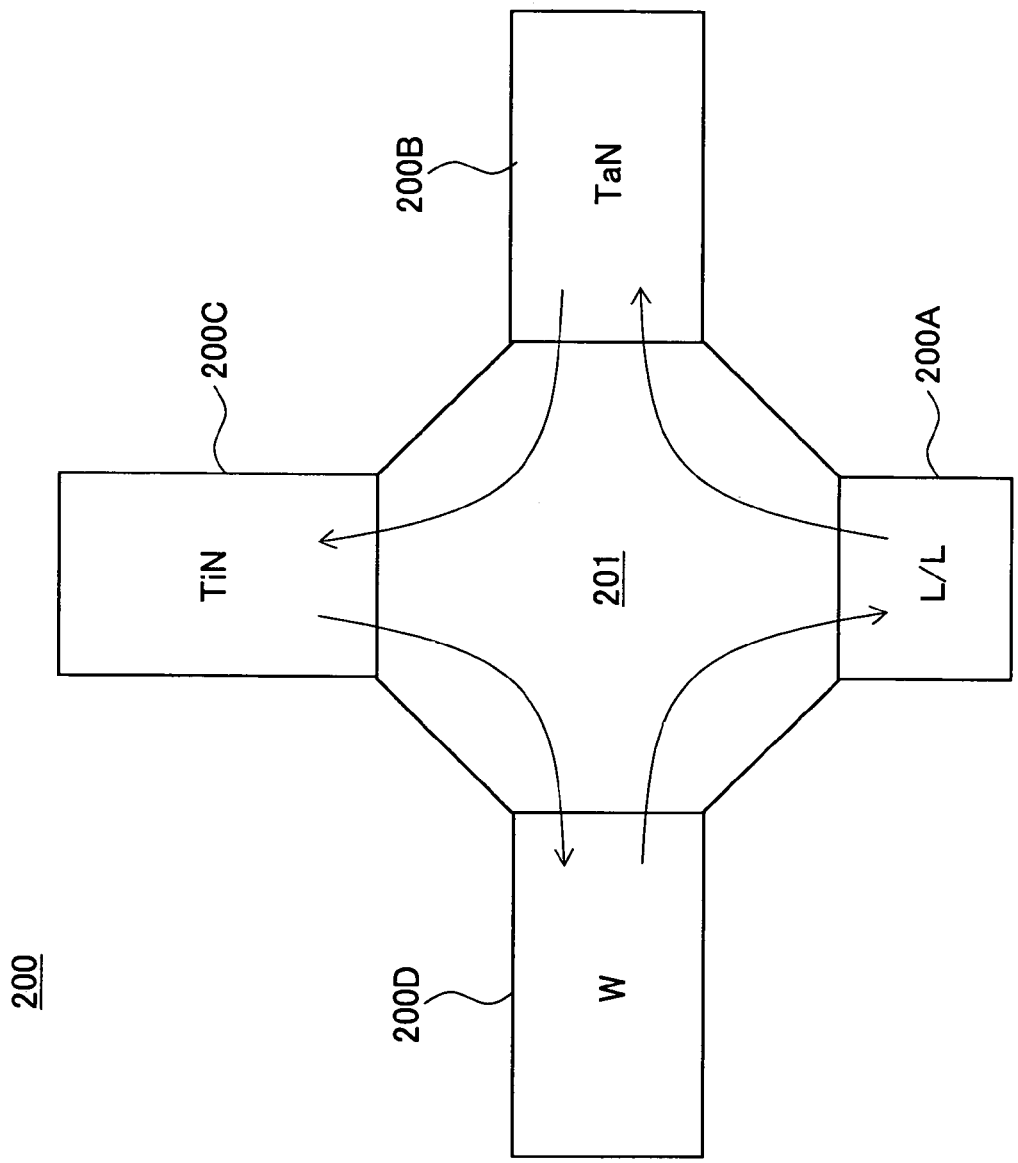

SEMICONDUCTOR DEVICE HAVING A MULTILAYER INTERCONNECTION STRUCTURE AND FABRICATION PROCESS THEREOF

CROSS-REFERENCE TO RELATED APPLICATION

The present application is based on Japanese priority application No. 2002-371134 filed on Dec. 20, 2002, the entire contents of which are hereby incorporated by reference.

BACKGROUND OF THE INVENTION

The present invention generally relates to semiconductor devices and more particularly to a semiconductor device having a multilayer interconnection structure and fabrication process thereof.

Conventionally, increase of operational speed of semiconductor devices has been attempted according to the so-called scaling law by miniaturizing the semiconductor device.

Meanwhile, such recent highly miniaturized semiconductor devices and integrated circuits generally use multilayer interconnection structure for interconnecting numerous semiconductor elements formed on the substrate. In such a multilayer interconnection structure, it should be noted that the total extension of the interconnection patterns has reached an enormous length and there arises a problem of serious signal delay caused by the multilayer interconnection structure.

Thus, investigations are being made for solving the foregoing problem of signal delay caused in a multilayer interconnection structure, by using an inorganic insulation film or organic insulation film having small specific dielectric constant for the insulation film that constitutes the interlayer insulation film of a multilayer interconnection structure in place of conventionally used insulation film of the $SiO_2$ system, and further by using copper having a large atomic weight and low resistance for the interconnection pattern in place of conventionally used aluminum. In the case of using copper for the interconnection pattern, however, there arises a problem that patterning of the interconnection pattern by dry etching process, which has been used successfully in the conventional multilayer interconnection structure, is difficult. Because of this, copper interconnection patterns have been formed by way of so-called damascene process or dual damascene process.

However, there are still various problems to be solved in the art of damascene process when forming copper interconnection patterns such as large number of process steps. Further, there are remaining problems such as stress migrations, electromigrations, and the like.

In view of the foregoing situations, there are cases in current ultrafine semiconductor integrated circuits that use copper for the wiring patterns, to use a copper interconnection pattern formed by damascene process only for the lower layer part where the demand for suppressing the signal delay is stringent while continuously using aluminum multilayer interconnection structure in the upper layer part where the demand of suppressing signal delay is less stringent.

In the case of forming a multilayer interconnection structure having an aluminum interconnection pattern on a multilayer interconnection structure that uses a copper interconnection pattern, there is a need of connecting the lower level copper interconnection pattern and an upper level aluminum interconnection pattern electrically by way of a conductive plug. Conventionally, tungsten, capable of being formed by a CVD process and thus capable of filling a minute via-hole with excellent step coverage, has been used extensively for such a conductive plug.

FIG. 1 shows a connection structure 10 that connects a lower level copper interconnection pattern and an upper level aluminum interconnection pattern through a tungsten plug formed in an interlayer insulation film. It should be noted that the connection structure 10 of FIG. 1 is the one formed in the investigation made by the inventor of the present invention and constituting the foundation of the present invention.

Referring to FIG. 1, a wiring groove 11G having a side wall and a bottom surface covered with a barrier metal film 11A is formed in the interlayer insulation film 11 in the conventional connection structure 10, and the wiring groove 11G is filled with a copper interconnection pattern 11Cu formed by a damascene process or a dual damascene process. As a result of the CMP process associated with the damascene process, the interlayer insulation film 11 and the copper interconnection pattern 11Cu have the same top principal surface, and a next interlayer insulation film 12 is formed on such a top principal surface via a barrier film 12N, which may be formed of SiN, and the like.

In the interlayer insulation film 12, there is formed a via-hole 12V penetrating through the barrier film 12N so as to expose the copper interconnection pattern 11C, and the side wall surface and the bottom surface of the via-hole 12V are covered by a barrier metal film 12A, which in turn is formed by consecutively stacking a TaN film 12a and a Ta film 12b, and further a barrier metal film 12B of TiN formed on the barrier metal film 12A. In the via-hole 12V thus covered with the barrier metal films 12A and 12B, a tungsten plug 12W is formed so as to fill the space inside the via-hole 12V by a CVD process and a CMP process conducted after the CVD process.

Further, an aluminum interconnection pattern 13 formed of an aluminum base alloy such as aluminum or aluminum copper is formed on the interlayer insulation film 12, in which the tungsten plug 12W is thus formed, via an adhesion film 13A of Ti and a barrier metal film 13B of TiN.

In the illustrated example, another barrier metal film 13C of TiN is formed on the surface of the aluminum interconnection pattern 13 as usual.

Further, there has been a proposal of connecting the copper interconnection pattern of upper level and the copper interconnection pattern of lower level also by using such a tungsten plug.

FIGS. 2A–2E show the process of forming the connection structure of FIG. 1.

Referring to FIG. 2A, the SiN film 12N is deposited on the interlayer insulation film 11, in which the copper interconnection pattern 11Cu is embedded by a damascene process not illustrated, by conducting a plasma-enhanced CVD process. Next, in the step of FIG. 2B, the interlayer insulation film 12 is formed on the SiN film 12N by a plasma-enhanced CVD process etc. In the step of FIG. 2B, a via-hole 12V is formed further in the interlayer insulation film 12 through the SiN film 12N so as to expose the copper interconnection pattern 11Cu.

Next, in the step of FIG. 2C, a dry etching process is conducted to the copper interconnection pattern 11Cu exposed in the step of FIG. 2B by using high frequency plasma with a depth of about 15 nm such that the via-hole diameter is increased slightly at the upper part of the via-hole 12V, and the TaN film 12a and the Ta film 12b are deposited on the structure of FIG. 2B by a reaction sputtering process so as to include the via-hole 12V. With this, the barrier metal film 12A is formed. Further, in the step of FIG. 2C, the TiN film 12B is formed on the barrier metal film 12A as the next barrier metal film also by a reactive sputtering process.

In a typical example, the TaN film 12a and the Ta film 12b are formed to have the thicknesses of 20 nm and 30 nm, respectively, while the TiN film 12B is formed to have the thickness of 50 nm. In such a construction, the barrier metal films 12A and 12B form a TaN/Ta/TiN stacked structure. Alternatively, it is possible to form a TaN/Ta/TaN/Ta/TiN structure by repeatedly stacking the TaN film 12a and the Ta film 12b in the barrier metal film 12A. In this case, the TaN film may be formed to have the thickness of 10 nm and the Ta film may be formed to have the thickness of 15 nm.

Further, a tungsten film 12 is deposited in the step of FIG. 2D on the structure of FIG. 2C so as to fill the via-hole 12V by conducting by a CVD process while using $WF_6$ as a gaseous source. By removing the tungsten film 12 and also the barrier metal films 12B and 12A consecutively from the interlayer insulation film 12 by a CMP process, the structure of FIG. 2E is obtained.

By forming the barrier metal films 13A and 13B and further the aluminum interconnection pattern 13 on the structure of FIG. 2E thus obtained, the structure shown in FIG. 1 is obtained.

SUMMARY OF THE INVENTION

In the investigation that constitutes the foundation of the present invention, the inventor of the present invention has discovered that there is caused a corrosion 12X in the Ta film 12b covering the sidewall surface of the via-hole 12V as shown in FIGS. 3A and 3B in the case the contact structure of FIG. 1 is miniaturized and the aspect ratio (depth/diameter ratio) of the via-hole 12V has exceeded 1.25. Also, it was discovered that a corrosion 11X tends to occur also in the copper interconnection pattern 11Cu. It should be noted that FIG. 3A shows the schematic cross-section of the via-plug while FIG. 3B shows the SEM photograph of the actual cross-section of the via-plug. It should be noted that the via-plug shown in the photograph of FIG. 3B has the aspect ratio of 1.4.

When such a defect is caused in the sidewall surface of the via-plug or in the contact part of the copper interconnection pattern contacting with the via-plug as a result of such corrosion, not only the contact resistance is increased but also the resistance to the electromigration or stress migration is deteriorated, and the yield and reliability of the semiconductor device is degraded seriously.

Accordingly, it is the general object of the present invention to provide a novel and useful multilayer interconnection structure and fabrication process thereof, as well as a semiconductor device having such a multilayer interconnection structure.

Another and more specific object of the present invention is to eliminate, in a multilayer interconnection structure in which a copper interconnection layer and an upper level interconnection layer are connected with each other via a minute contact hole formed in an interlayer insulation film interposed between the copper interconnection layer and the upper interconnection layer, the problem of corrosion caused in the barrier metal film surrounding the tungsten plug formed in the foregoing minute contact hole or the problem of corrosion caused in the copper interconnection layer.

Another object of the present invention is to provide a multilayer interconnection structure, comprising:

a first interconnection layer including a copper interconnection pattern;

an interlayer insulation film formed on said first interconnection layer;

a second interconnection layer formed on said interlayer insulation film;

a via-hole formed in said interlayer insulation film so as to expose said copper interconnection pattern; and a tungsten plug formed in said via-hole so as to connect said first interconnection layer and said second interconnection layer electrically, said via-hole having a depth/diameter ratio of 1.25 or more, wherein there is formed a conductive nitride film between an outer wall of said tungsten plug and an inner wall of said via-hole such that said conductive nitride film is defined by an inner wall contacting with said outer wall of said tungsten plug and an outer wall contacting with said inner wall of said via-hole.

The present invention further provides a semiconductor device having such a multilayer interconnection structure.

Another object of the present invention is to provide a method of forming a multilayer interconnection structure, comprising the steps of:

forming an interlayer insulation film on a first interconnection layer including a copper interconnection pattern;

forming a via-hole in said interlayer insulation film so as to expose said copper interconnection pattern;

introducing a substrate carrying thereon said first interconnection layer and said interlayer insulation film into a reactive sputtering apparatus and forming a nitride film on said interlayer insulation film by a reactive sputtering process, such that said nitride film covers an inner wall surface of said via-hole;

forming a tungsten plug, after said step of forming said nitride film, on said interlayer insulation film such that said tungsten plug fills said via-hole; and forming a second interconnection layer, after said step of forming said tungsten plug, on said interlayer insulation film, wherein there are provided, after said step of forming said nitride film but before said step of forming said tungsten plug, the steps of:

isolating said substrate from a sputtering target provided in said reactive sputtering apparatus; and cleaning a surface of said sputtering target, after said step of forming said nitride film, in said reactive sputtering apparatus in a state in which said substrate is isolated from said sputtering target.

According to the present invention, the entirety of the barrier metal film covering the tungsten plug is formed by a nitride film. As a result, there occurs no exposure of the metal film such as Ta even when the aspect ratio of the via-hole has been increased and step coverage of the barrier metal film formed of the conductive nitride film in the via-hole is deteriorated. With this, there occurs no corrosion in the barrier metal film even in the case of depositing a tungsten film by using a highly reactive fluoride source material such as $WF_6$, and the like, and occurrence of defects in the contact structure is effectively suppressed. In order to form the barrier metal film not containing a metal film by a reactive sputtering process, the present invention conducts the cleaning process of the sputtering target, which has to be conducted after the reactive sputtering process of the nitride barrier metal film such as TaN for suppressing particle formation, in the state that the substrate formed with the nitride film is isolated from the sputtering target. As a result, there occurs no metal film deposition on the nitride barrier metal film during the cleaning process, and there occurs no corrosion in the barrier metal film even when the via-hole formed with the nitride barrier metal film is later filled with a tungsten film by conducting a CVD process while using a fluoride gaseous source such as $WF_6$. Particularly, by using a single-wafer processing apparatus, it become possible to conduct a next process during the cleaning process in parallel with the cleaning process, by forwarding the substrate to be processed to the next processing chamber, and the throughput of forming the multilayer interconnection structure is improved.

Further, according to the present invention, the reaction between the fluoride gaseous source and the copper interconnection pattern is suppressed effectively at the time of filling the via-hole formed with the barrier metal film by a tungsten film by conducting a CVD process while using a fluoride gaseous source such as $WF_6$ and the like, by supplying a hydrogen gas concurrently to the deposition process or alternatively by processing the foundation structure by plasma of a gas containing hydrogen in advance to the deposition. Thereby, the problem of corrosion of the copper interconnection pattern is effectively suppressed.

Other objects and further features of the present invention will become apparent from the following detailed description when read in conjunction with the attached drawings.

BRIEF DESCRIPTION OF THE DRAWINGS

FIG. 1 is a diagram showing the construction of a conventional multilayer interconnection structure using a barrier metal film having a TaN/Ta/TiN stacking structure;

FIG. 4 is a diagram showing the construction of a multilayer interconnection structure according to a first embodiment of the present invention;

FIGS. 10A and 10B are diagrams showing a deposition process of the tungsten film according to the second embodiment of the present invention;

FIGS. 13A and 13B are diagrams showing the distribution of the chain resistance in the multilayer interconnection structure of the present invention in comparison with the distribution of chain resistance of the multilayer interconnection structure formed by a conventional technology;

FIG. 15 is a diagram showing the construction of a cluster style substrate processing apparatus used in a third embodiment of the present invention;

DETAILED DESCRIPTION OF THE INVENTION

[Principle]

Figure 2A:
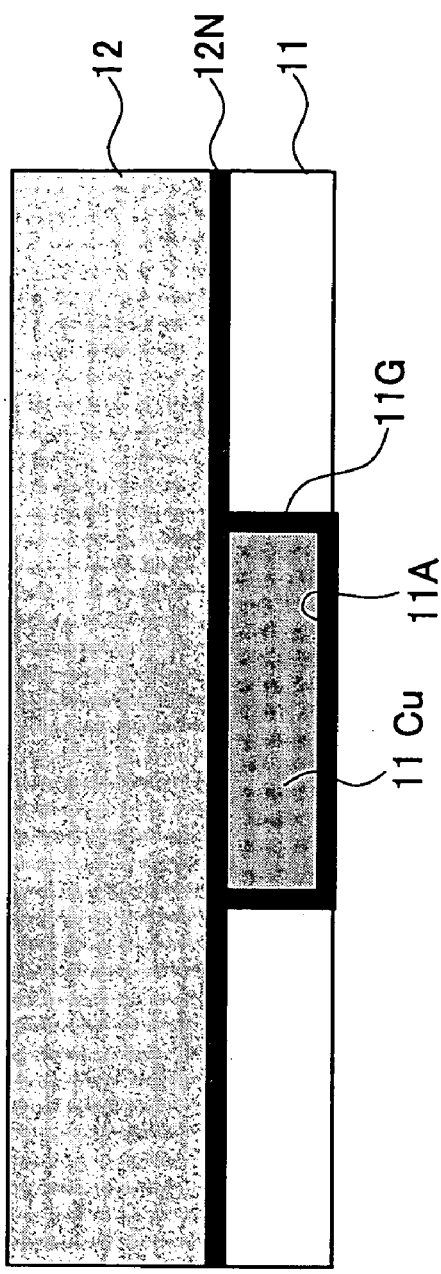
FIGS. 2A–2E are diagrams showing the formation process of the multilayer interconnection structure of FIG. 1.
Figure 2B:
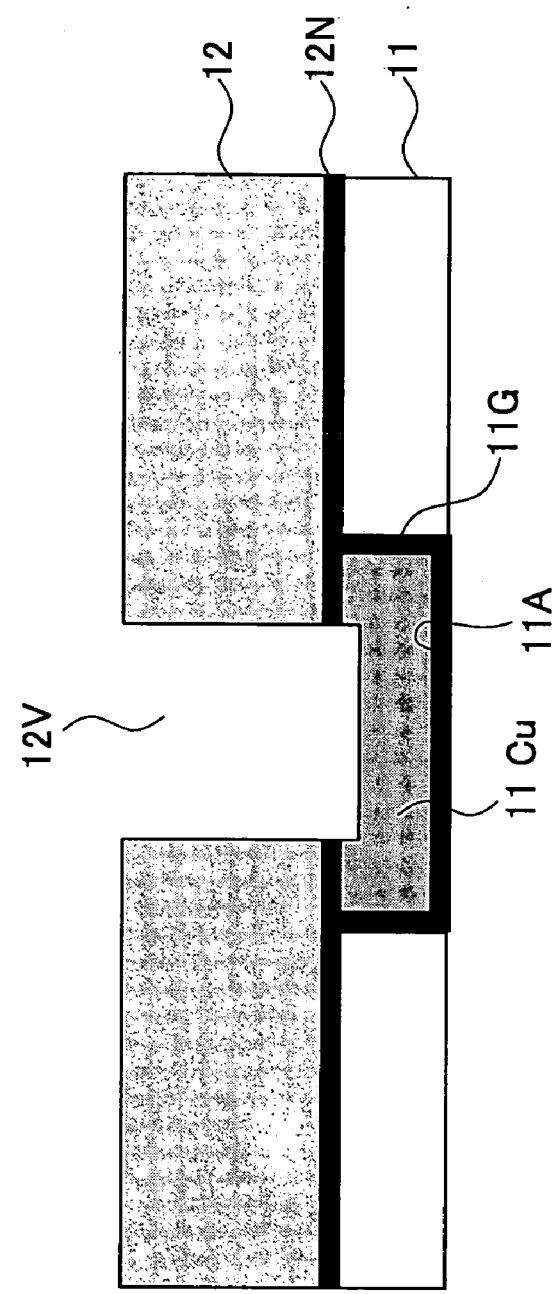
Figure 2C:
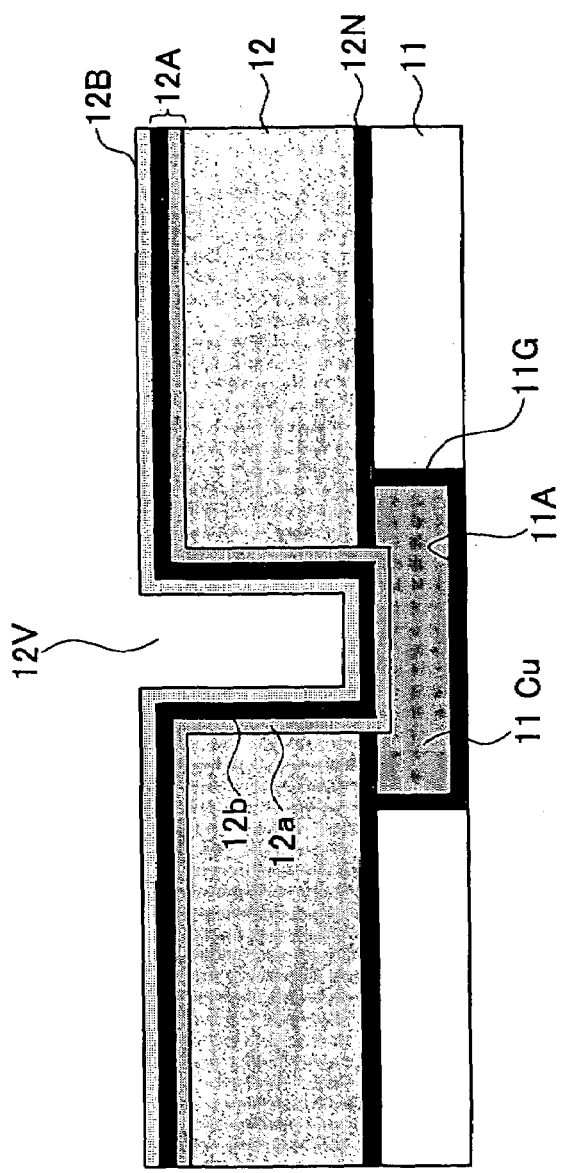
Figure 2D:
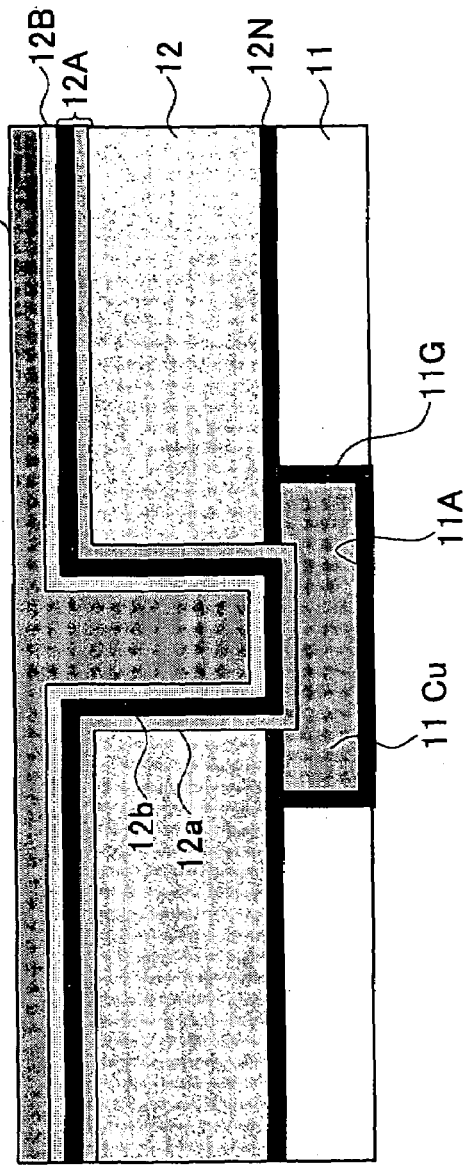
Figure 2E:
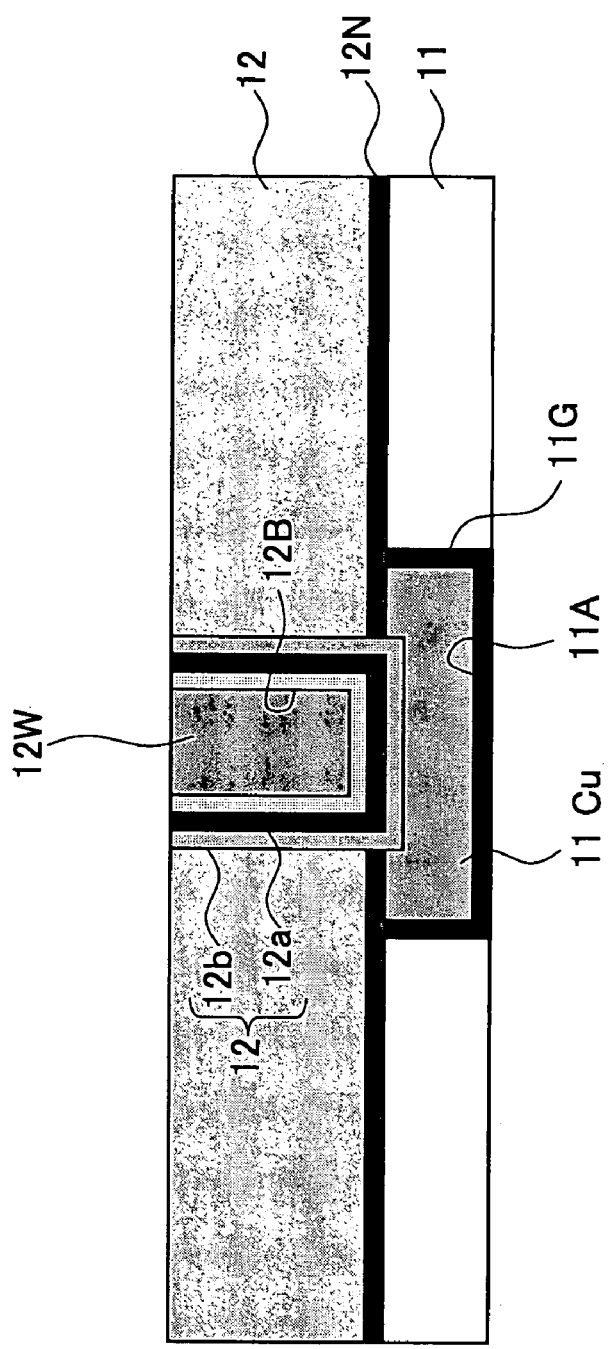
Figure 3A:
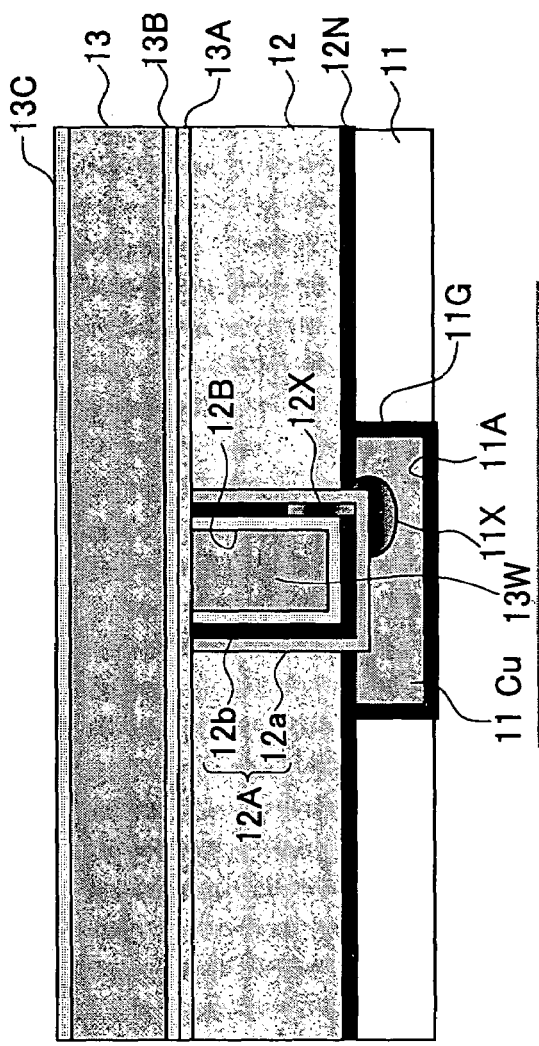
FIGS. 3A and 3B are diagrams showing a conventional problem.
Figure 3B:
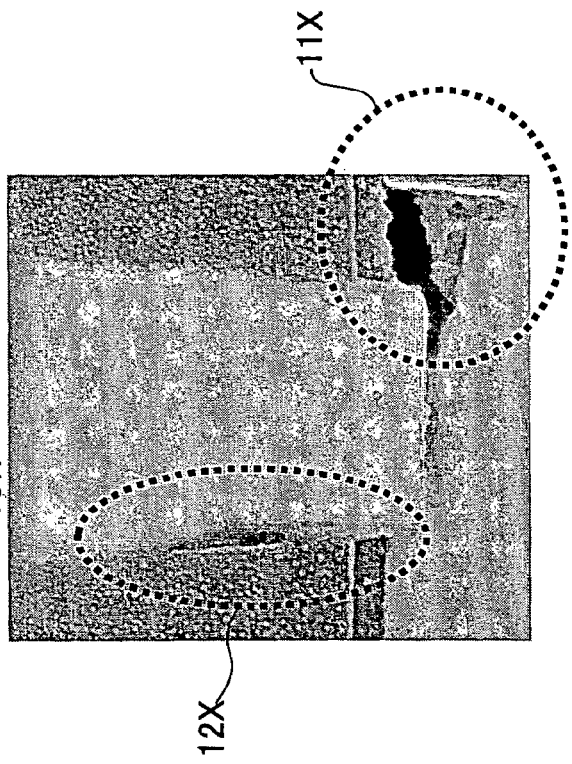

The inventor of the present invention has studied the mechanism of formation of the defects 11X and 12X shown in FIGS. 3A and 3B in the investigation that constitutes the foundation of the present invention and discovered that the defect 12X is formed in the step of FIG. 2D for forming the W layer 13 by the CVD process by using $WF_6$ as the gaseous source. More specifically, there is caused a reaction between the $WF_6$ gas and the Ta film 12b, and as a result of this reaction, the defect 12X is formed in the form of cavity. Further, it was discovered that the foregoing reaction between the $WF_6$ gas and Ta film 12b is caused as a result of poor step coverage of the TiN film 12B covering the Ta film 12b in the via-hole 12V in the case the aspect ratio of the via-hole 12V is increased with increased degree of miniaturization of the semiconductor device. Such exposure of the TaN Ta film 12b is caused particularly at the bottom part of the via-hole 12V.

Further, it was discovered that the defect 11X occurring in the copper interconnection pattern 11Cu is caused also as a result of reaction of the gaseous source of tungsten such as $WF_6$ with the copper interconnection pattern 11Cu via the cavity thus formed in the barrier metal.

In the conventional barrier metal film 12A, it should be noted that the Ta film 12b does not actually contribute to the performance of the film 12A as a barrier metal. The Ta film 12b is merely formed during the cleaning process of the Ta target used in the reactive sputtering process of the TaN film 22a. This cleaning process is conducted for the purpose of avoiding the problem of particle formation, which is caused when the deposition of the TaN film is continued by the reactive sputtering process.

Thus, the present invention proposes, based on the foregoing discovery, to suppress the formation of metal film or metal part such as the Ta film in a barrier metal film in the case of forming the barrier metal film in a minute via-hole having an aspect ratio of 1.25 or more by using a reactive sputtering process, by isolating the substrate to be processed during the cleaning process of the sputtering target, which cleaning process being conducted after the deposition of the nitride film.

As a result of the present invention, the barrier metal film covering the minute via-hole is formed solely by a conductive nitride film, and the problem of occurrence of corrosion reaction of the barrier metal film caused at the time of filling the via-hole by a CVD process of tungsten by the CVD source gas, is positively avoided. In the present invention, it should be noted that the conductive nitride film is not necessarily be a stoichiometric nitride film but may be a film that contains sufficient amount of nitrogen effective for preventing reaction with the gaseous source of tungsten.

According to the present invention, the entirety of the barrier metal covering the tungsten plug is formed of a nitride film. Thus, there is no possibility that a metal film such as Ta film is exposed as a result of increase of the aspect ratio of the via-hole and associated degradation of step coverage of the conductive nitride film constituting the barrier metal film. Thus, there occurs no corrosion in the barrier metal film even when a highly reactive fluoride source material such as WF6 is used for deposition of a tungsten film, and the occurrence of defects in the contact structure is positively eliminated.

In order to form the barrier metal film by a reactive sputtering process such that the barrier metal film does not contain a metal film, the present invention conducts the cleaning process of the sputtering target, conducted after the reactive sputtering deposition of the nitride barrier metal film such as TaN for suppressing particle formation, in the state that the substrate formed with the nitride film is isolated from the sputtering target. As a result, deposition of metal film on the nitride barrier metal film during the cleaning process is eliminated, and there occurs no corrosion in the barrier metal even in the case the via-hole thus formed with the nitride barrier metal film is filled with a tungsten film by a CVD process while using a fluoride gaseous source such as $WF_6$. In the case of using a single wafer processing system, it is possible to forward the substrate to a next processing chamber during the cleaning process, and it becomes possible to conduct a next process concurrently to the cleaning process. Thereby, the throughput of formation of the multilayer interconnection structure is improved significantly.

Further, according to the present invention, it becomes possible to suppress the reaction between the fluoride gaseous source and the copper interconnection pattern in the case of filling a via-hole formed with a barrier metal film by a CVD process of the fluoride gaseous source such as WF6, by conducting the deposition process while supplying a hydrogen gas, or by processing the base structure by plasma of a gas containing hydrogen before the deposition. Thereby, the problem of corrosion of the copper interconnection pattern is also suppressed effectively.

FIRST EMBODIMENT

FIG. 4 is a diagram showing a multilayer interconnection structure according to a first embodiment of the present invention.

Referring to FIG. 4, a wiring groove 21G is formed in an interlayer insulation film 21, and the wiring groove 21G is covered by a barrier metal film 21A. Further, the wiring groove is formed with a copper interconnection pattern 21Cu by using a damascene process. Here, it should be noted that the interlayer insulation film 21 is formed on the silicon substrate not illustrated, and an interlayer insulation film 22 is formed on the interlayer insulation film 21 via a SiN barrier film 22N. Further, a via-hole 22V exposing the copper interconnection pattern 21Cu is formed in the interlayer insulation film 22 so as to penetrate through the barrier film 22N with an aspect ratio of 1.25 or more, such as 2.4.

In one example, the interlayer insulation film is formed by polishing an SiO2 film, formed by a plasma CVD process with the thickness of 1100 nm, to the thickness of 730 nm by conducting a CMP process. Thereby, the via-hole 22V may be formed with the aspect ratio of 1.4. Further, the barrier film 22N is formed to the film thickness of 70 nm by a plasma CVD process, and the copper interconnection pattern 21Cu is formed to the thickness of 450 nm.

In the present embodiment, the inner wall surface and the bottom surface of the via-hole 22V are covered with a TaN barrier metal film 22a continuously with the thickness of 25 nm, while the TaN barrier metal film 22a is covered by a TiN film 22B having the thickness of 75 nm. Thus, in the present embodiment, no metal film or metal part is included in the barrier metal film 22A in the via-hole 22V.

In the via-hole 22V, it should be noted that the space inside the TiN film 22B is filled with a tungsten plug 22W, wherein the tungsten plug 22W has a surface coincident to the surface of the interlayer insulation film 22 by conducting polishing process by a CMP process.

On the interlayer insulation film 22 thus formed with the tungsten plug 22W, there is provided an interconnection layer 23 of aluminum or an aluminum base alloy via a Ti adhesive film 23A and a TiN barrier film 23B. In the illustrated example, another TiN barrier film 23C is formed on the foregoing aluminum interconnection layer 23.

FIGS. 5A–5D show the formation process of the multilayer interconnection structure of FIG. 4.

Figure 5A:
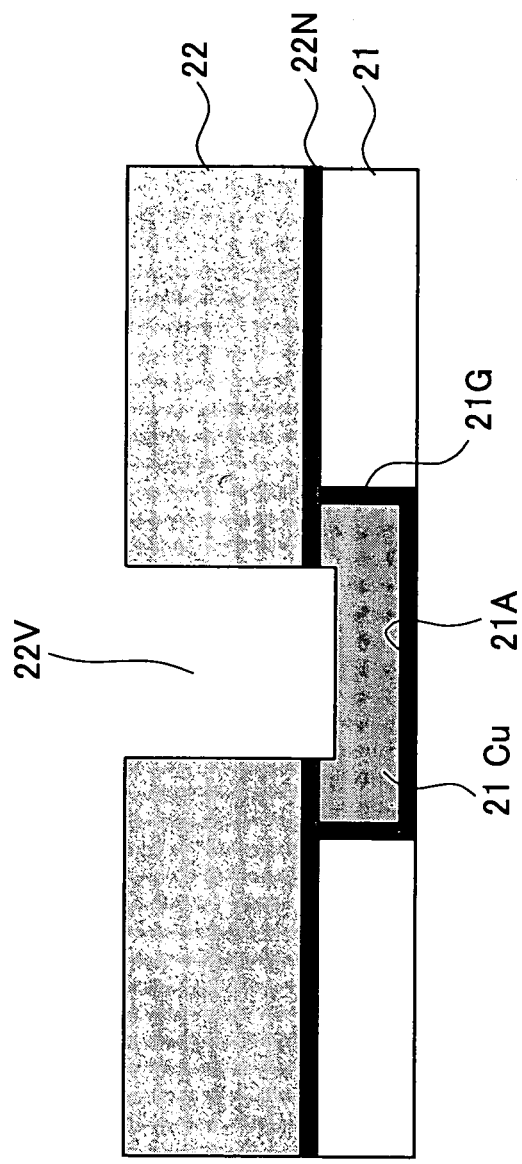
FIGS. 5A–5D are diagrams showing the formation process of the multilayer interconnection structure of FIG. 4.
Figure 5B:
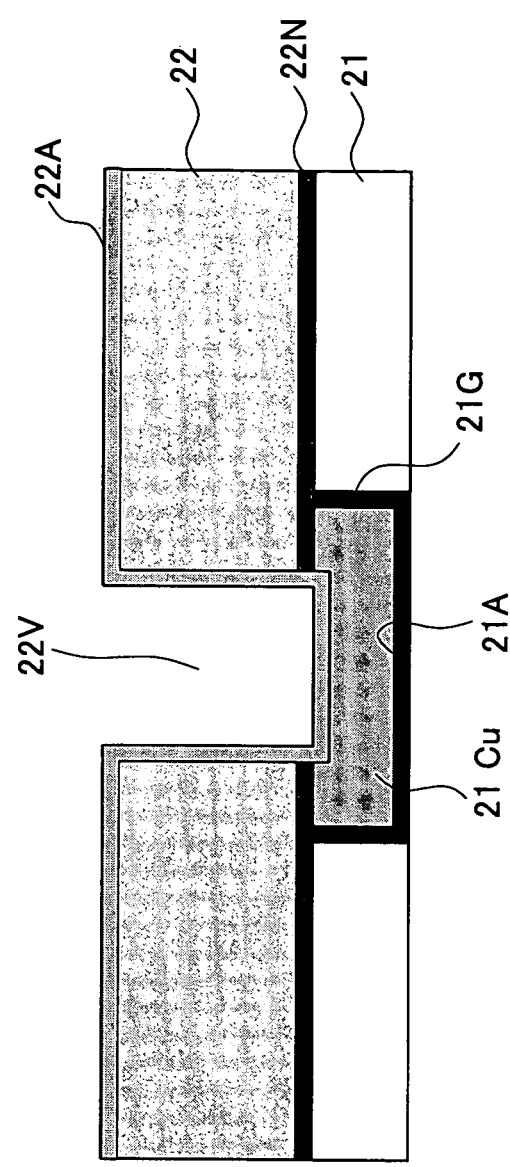
Figure 6:
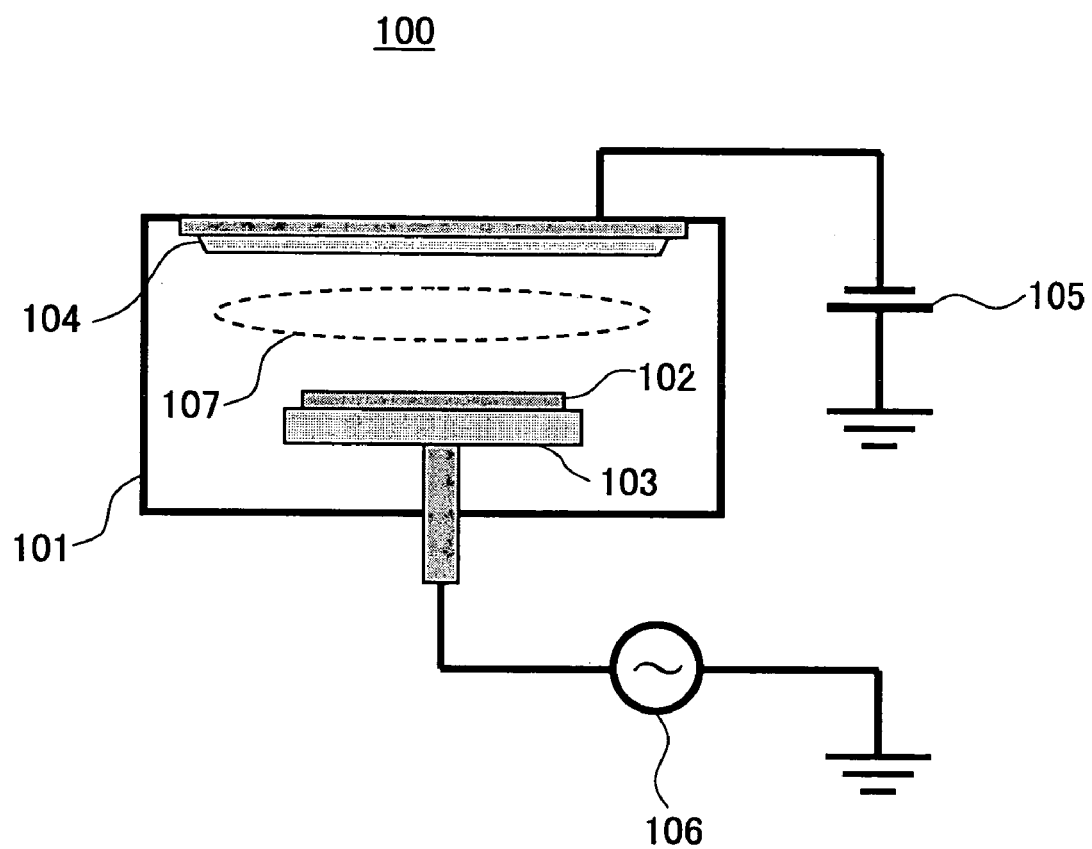
FIG. 6 is a diagram showing the schematic construction of a reactive sputtering apparatus used with the present invention.

Referring to FIG. 5A, the via-hole 22V is formed in the interlayer insulation film 22 so as to expose the copper interconnection pattern 21Cu, and the structure of FIG. 5A is introduced into the reactive sputtering apparatus 100 shown in FIG. 6 in the step of FIG. 5B, after conducting a dry etching process in the exposed copper interconnection pattern 21Cu in the RF plasma with a depth of about 25 nm.

Referring to FIG. 6, the reactive sputtering apparatus 100 includes a processing chamber 101 evacuated by a vacuum evacuation system not illustrated and containing a stage 103 for holding a substrate 102, wherein the processing chamber 101 further includes a sputtering target 104 formed of a metallic Ta such that the target 104 faces the substrate 102 to be processed 102.

Thus, plasma 107 is formed in the processing chamber 101 between the target 104 and the substrate 102 by introducing a rare gas such as Ar into the processing chamber 101 after vacuum evacuation and by applying DC bias to the target 104 from a DC power supply 105 and an AC bias to the substrate 102 to be processed from an AC power supply 106, and the particles sputtered from the target 104 by the plasma 107 are deposited on the surface of the substrate 102.

By introducing nitrogen gas in the processing chamber 101 at the time of such a sputtering process, there is caused deposition of a TaN film on the surface of the substrate to be processed 102. The TaN film thus deposited tends to have a non-stoichiometric composition represented as $TaN_x$.

In the case the sputtering process is continued in the state in which nitrogen gas is introduced to the processing chamber 101, on the other hand, there is formed a thick TaN film on the surface of the sputtering target 104, and because of this, there arises a problem in that particles are formed when the sputtering target 104 thus formed with such a thick TaN film is sputtered. It is these particles that become the cause of the defects formed on the substrate surface.

Figure 7A:
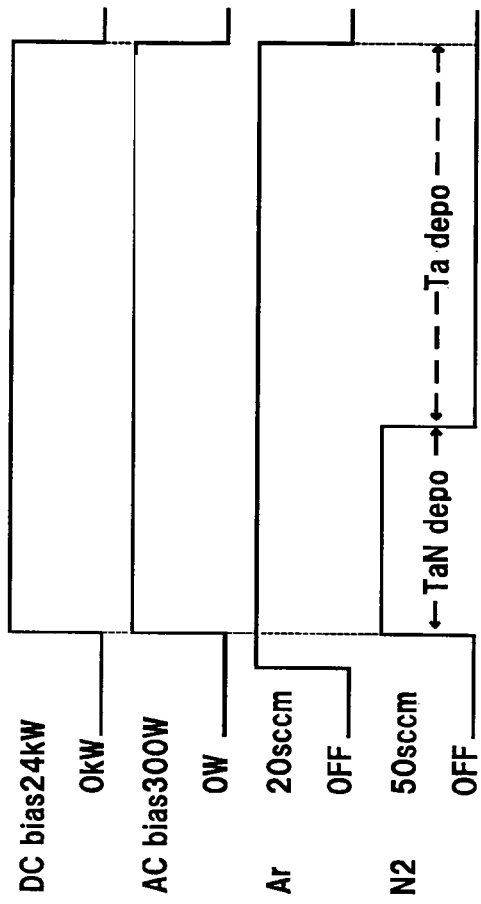
FIGS. 7A and 7B are diagrams respectively showing examples of sputtering recipe used conventionally and used in a first embodiment of the present invention with the reactive sputtering apparatus of FIG. 6.

Thus, it has been practiced conventionally in the art to conduct the deposition of a Ta film on the TaN film deposited previously in the process of FIG. 5B in the reactive sputtering apparatus 100 of FIG. 6, for avoiding the problem of particle formation in the reactive sputtering apparatus, by interrupting the supply of the nitrogen gas to the processing chamber 101 after the deposition of the TaN film as shown in FIG. 7A. Here, it should be noted that FIG. 7A shows an example of the conventional sputtering recipe used with the reactive sputtering apparatus 100.

Referring to FIG. 7A, an Ar gas is introduced into the processing chamber 101 with a flow rate of 20 SCCM after the substrate to be processed is introduced into the processing chamber 101, and a DC bias power and an AC bias power are supplied respectively to the sputtering target 104 and the substrate 103 to be processed with the power of 24 kW and 300W, respectively. With this, plasma 107 is formed.

In the recipe of FIG. 7A, for example, a nitrogen gas is introduced into the processing chamber 101 with a flow rate of 80 SCCM at the same time as the formation of the plasma 107, and deposition of the TaN film is caused on the surface of the substrate 102.

In order to avoid the problem of particle formation mentioned previously, on the other hand, the supply of the nitrogen gas is interrupted in the recipe of FIG. 10A after a predetermined period has elapsed, and as a result, a Ta film is deposited on the TaN film. The Ta film 12b used in the conventional multilayer interconnection structure explained previously with reference to FIG. 1 has been formed because of such a reason.

Figure 7B:
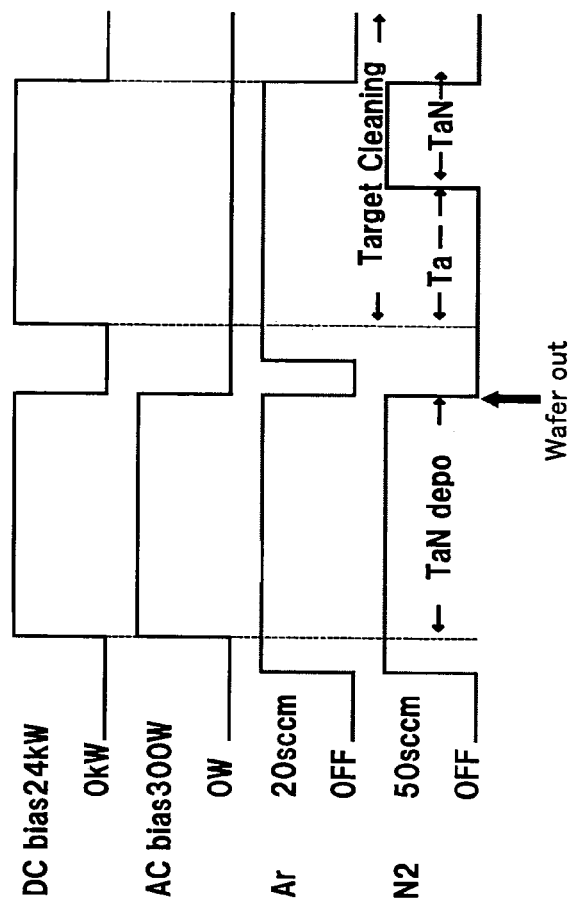

Contrary to this, the present invention uses the recipe of FIG. 7B in the step of FIG. 5B and suppresses the deposition of the Ta film on the TaN film 22A and simultaneously avoids the problem of particle formation in the reactive sputtering apparatus 100, by taking out the substrate 102 from the processing chamber 101 after deposition of the TaN film 22A on the structure of FIG. 5A and sputtering the Ta target 104 surface in Ar plasma ambient in this state. Thus, in the present invention, the substrate to be processed is evacuated outside the sputtering device after deposition of the TaN film 22A and conduct a cleaning process on the surface of the Ta target 104 by means of the Ar plasma ambient.

FIG. 7B shows an example of the sputtering recipe used with the reactive sputtering apparatus 100 of FIG. 6 in the present invention.

Referring to FIG. 7B, the structure of FIG. 5A is introduced into the processing chamber 101 of FIG. 6 as the substrate 102 in the present embodiment, and the Ar gas and the nitrogen gas are introduced into the processing chamber 101 with respective the flow rates of 20 SCCM and 80 SCCM. Next, the DC bias and the AC bias are supplied to the target 104 and to the substrate 102 with the power of 24 kW and 300W, respectively. With this, a TaN film having the thickness of about 20 nm is formed on the structure of FIG. 5A as a barrier metal film 22A, such that the barrier metal film 22A covers the surface of the interlayer insulation film 22 and the sidewall surface and the bottom surface of the via-hole 22V continuously.

In the present embodiment, the DC bias and also the AC bias are interrupted with the timing shown with the arrow in FIG. 7B, and the supply of the Ar gas and the nitrogen gas to the processing chamber 101 is interrupted simultaneously. With this, plasma 107 in the processing chamber 101 is disappeared, and the substrate 102 is taken out to the outside of the processing chamber 101.

After the substrate 102 is thus taken out with the timing of the arrow, only the Ar gas is supplied to the processing chamber 101. Thus, the cleaning of the target 104 is implemented by applying a DC bias to the sputtering target 104 in this state. In this target cleaning process, the supply of the AC bias to the stage 103 is interrupted.

Figure 8:
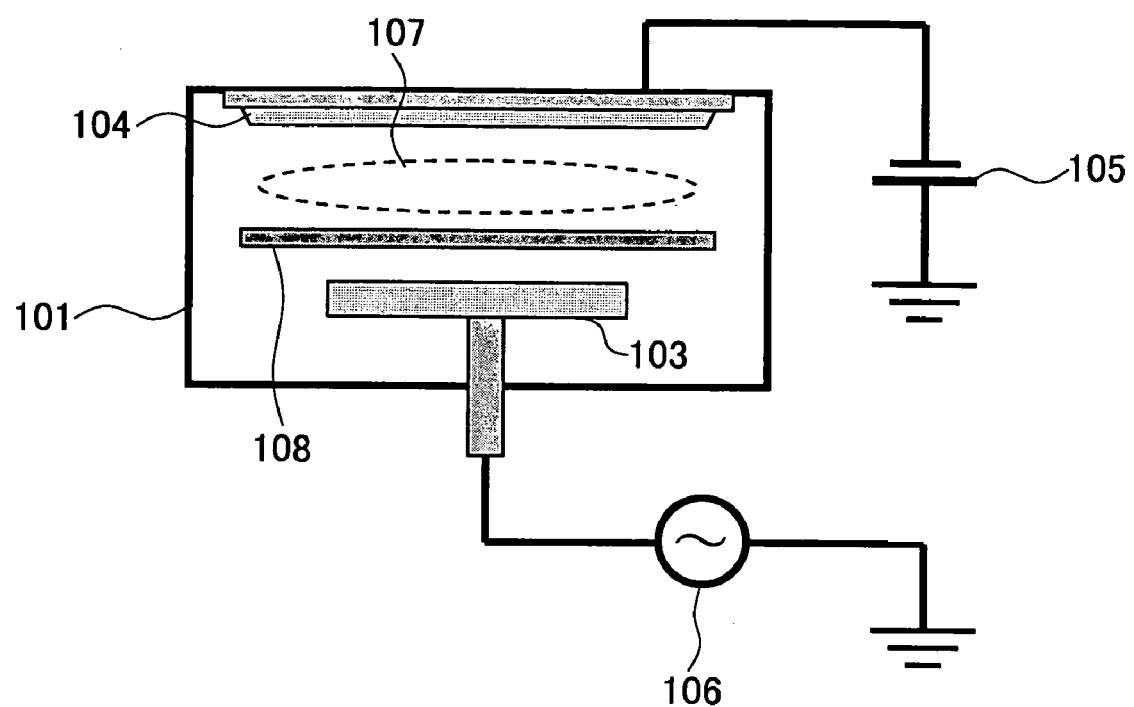
FIG. 8 is a diagram showing the sputtering process corresponding to the sputtering recipe of the present invention.

FIG. 8 shows the state of the reactive sputtering apparatus 100 during the target cleaning process of FIG. 7B.

Referring to FIG. 8, a shutter 108 typically formed of a stainless steel is inserted between the stage 103 and the sputtering target 104 in the cleaning process for eliminating deposition of the particles sputtered from the target 104 on the stage 103. For such a shutter 108, it is possible to use the one provided commonly in a sputtering apparatus.

Referring to FIG. 7B again, the TaN film that formed on the surface of the Ta target 104 is removed by such a cleaning process. On the other hand, it is preferable to form a thin TaN film on the surface of the target 104 by introducing a nitrogen gas for short time in the final phase of the cleaning process. By doing so, it becomes possible to suppress the deposition of a Ta-rich film on the substrate surface in the next sputtering process.

Figure 5C:
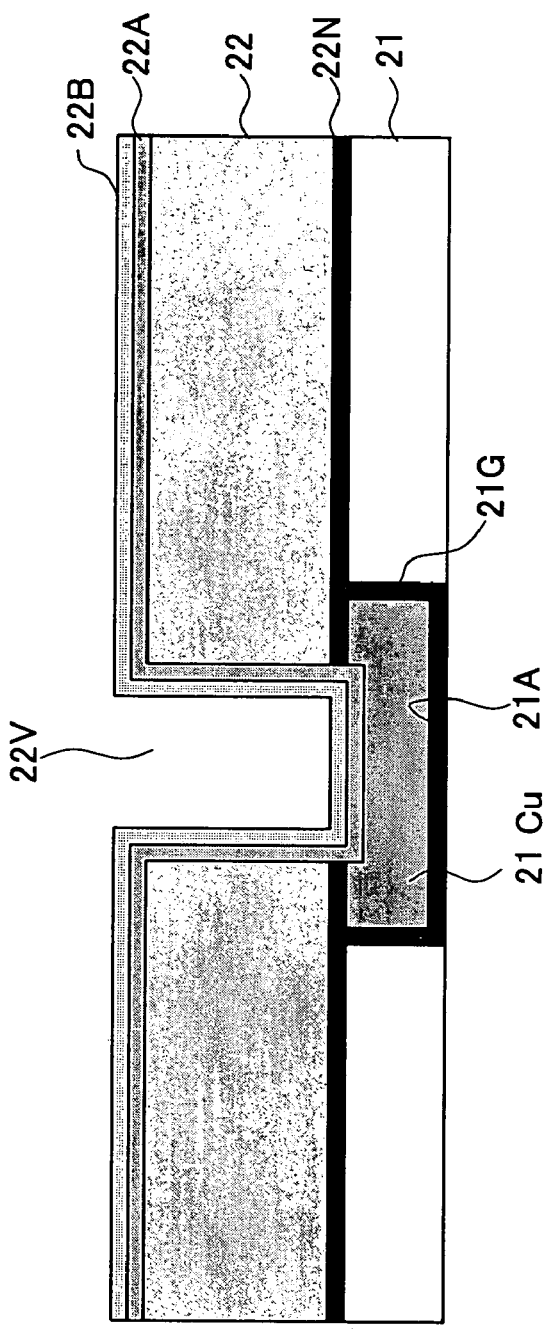

After the TaN barrier metal film 22A is thus formed as shown in FIG. 5B, a TiN barrier metal film 22B is formed on the structure of FIG. 5B in the step of FIG. 5C by a reactive sputtering process by using a Ti target. Further, a tungsten film 22W is formed on the TiN film 22B in the step of FIG. 5D by conducting a CVD process while using $WF_6$ as the gaseous source of tungsten, such that the tungsten film 22W fills the via-hole 22V. Details of deposition process of the tungsten film 22W of FIG. 5D will be described in the next embodiment.

Figure 5D:
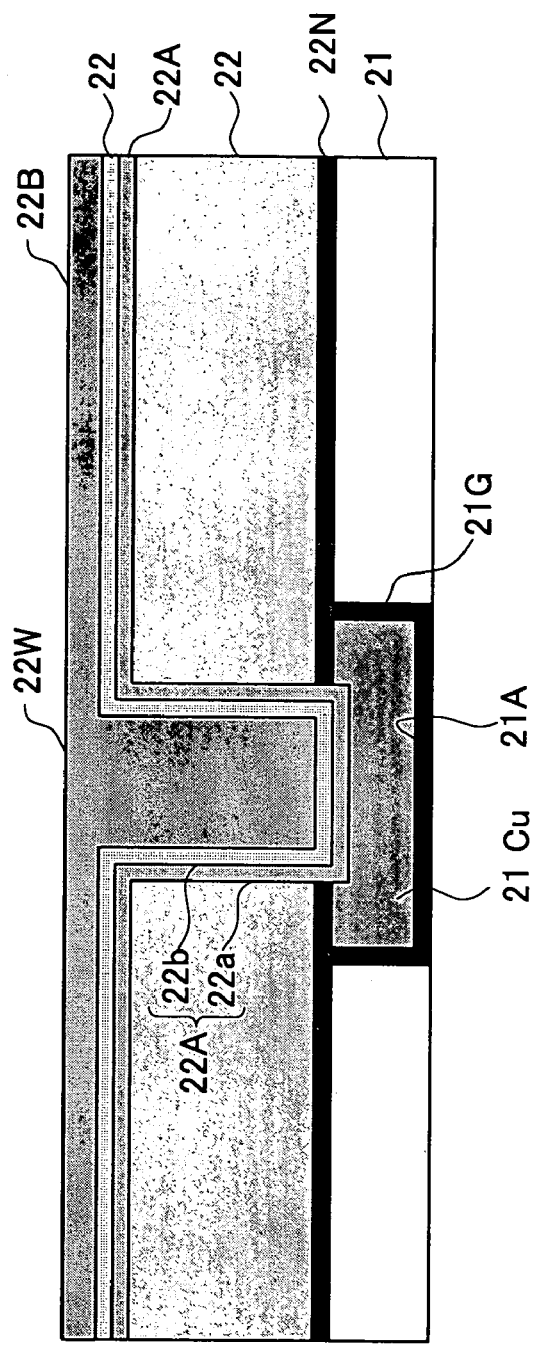

Further, in the structure of FIG. 5D, the tungsten film 22W, the TiN barrier metal film 22B and the TaN barrier metal film 22A that are deposited on the interlayer insulation film 22 are polished out consecutively a CMP process. Further, by forming the adhesion film 23A, the barrier metal films 23B and 23C, and also the aluminum interconnection pattern 23, a multilayer interconnection structure explained previously with reference to FIG. 4 is obtained.

According to the present embodiment, the sidewall surface and the bottom surface of the via-hole 22V are covered continuously by the TaN film 22A and the TiN film 22B in the step of FIG. 5D for depositing the tungsten film 22W by using corrosive $WF_6$ as the gaseous source. Further, because of the fact that the barrier metal film 22A is free from metal, there occurs no defect formation explained previously with reference to FIGS. 3A and 3B in the barrier metal film 22A even in the case the aspect ratio of the via-hole 22V is increased and the step coverage of the TiN film 22B at the via-hole 22V is deteriorated as a result of miniaturization of the semiconductor device.

As explained previously, the TaN film forming the barrier metal film 22A may not always have a stoichiometric composition. As long as the film contains sufficient amount of nitrogen for suppressing the reaction with $WF_6$, a film having a non-stoichiometric composition can also be used for the purpose of the present invention.

SECOND EMBODIMENT

Figure 9:
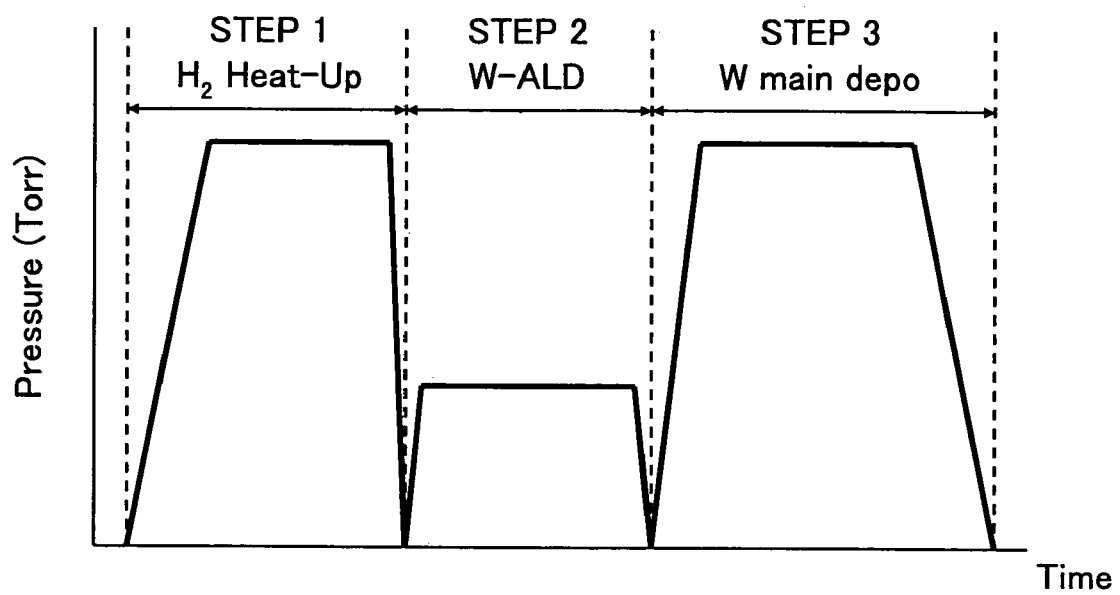
FIG. 9 is a diagram showing the outline of film formation process of a tungsten film according to a second embodiment of the present invention.

FIG. 9 shows the process pressure sequence used with the deposition process of the W film 22W in FIG. 5D explained before. Further, FIGS. 10A and 10B show a detailed process flow of the process of FIG. 5D corresponding to the sequence of FIG. 9.

The inventor of the present invention has discovered, in the investigation that constitutes the foundation of the present invention, that occurrence of defect in the barrier metal film 22A or copper interconnection pattern 21Cu at the time of deposition of the tungsten film is successfully suppressed when the film formation process of the tungsten film 22W of FIG. 5D is conducted while supplying a hydrogen gas.

Referring to FIG. 9, the structure of FIG. 5C is first heated in the present embodiment to a predetermined temperature in the ambient containing hydrogen (Stage 1), and a tungsten nucleation layer (passivation film) 23W1 is formed on a TiN under layer 22B of FIG. 5C as shown in FIG. 10A by an ALD (atomic layer deposition) process with a film thickness of about 8 nm (Stage 2), while continuing supply of the hydrogen gas.

Next, in the stage 3, a tungsten film 23W is deposited on the tungsten nucleation layer 23W1 while continuing the supply of the hydrogen gas as shown in FIG. 10B, such that the tungsten film 23W fills the via-hole 22V.

By forming the tungsten nucleation layer 23W1 on the TiN film 22B in this way, the incubation time at the time of forming the tungsten film 23W is decreased and the throughput of film formation process is improved.

Figure 11:
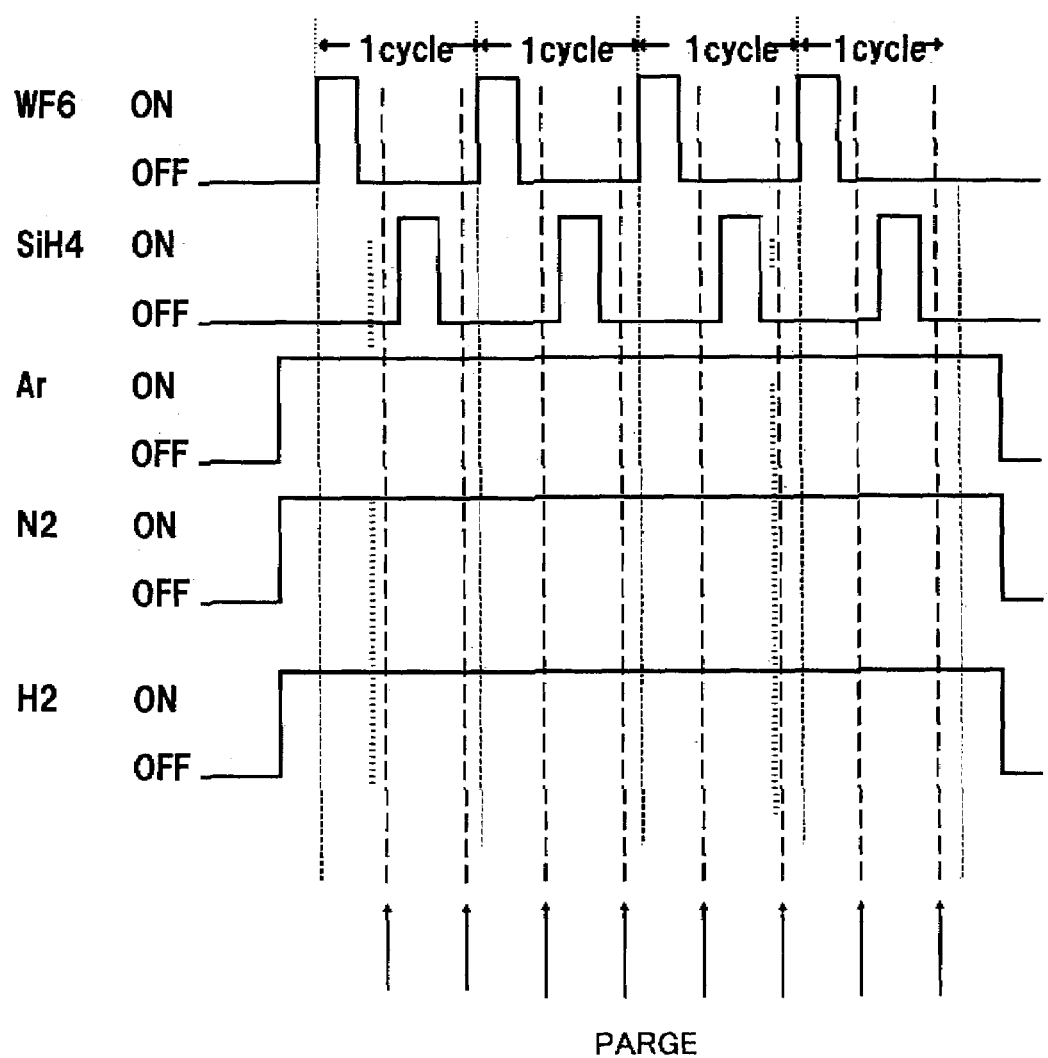
FIG. 11 is a diagram showing an example of ALD process recipe used with the process of FIG. 10A.

FIG. 11 shows the process sequence of Stage 2 of FIG. 9, in other words the process sequence at the time of forming the tungsten nucleation layer 23W1 in the process of FIG. 10A.

Referring to FIG. 11, the present embodiment supplies the Ar gas and the nitrogen gas as a carrier gas to a CVD apparatus not illustrated in the state in which the process pressure is set to 1 kPa (7.5 Torr) and the substrate temperature is set to 350° C. continuously with respective flow rates of 2000 SCCM and 900 SCCM. In the present embodiment, it should be noted that a hydrogen gas is further supplied continuously in addition to these carrier gases with a flow rate of 1200 SCCM.

In the process sequence of FIG. 11, the $WF_6$ gas and $SiH_4$ gas are supplied to the substrate surface alternately in this state. By supplying the $WF_6$ gas, the molecules of $WF_6$ are chemically absorbed on the surface of the TiN film 22B to form a single molecular layer of $WF_6$. The $WF_6$ molecules thus absorbed are then decomposed by the $SiH_4$ gas, and as a result, the tungsten film is grown one atomic layer by one atomic layer on the TiN film 22B. For example, the $WF_6$ gas may be supplied for only 5 seconds with a flow rate of 30 SCCM in each cycle. Further, the $SiH_4$ gas may be supplied for only 5 seconds with a flow rate of 18 SCCM in each cycle. In each cycle, there is provided an interval between the supply phase of the $WF_6$ gas and the supply phase of the $SiH_4$ gas as represented in the drawing by an arrow, and the excessive processing gas remaining in the process space at the substrate surface is purged during this interval by the Ar gas and the nitrogen gas that are supplied continuously.

Figure 12B:
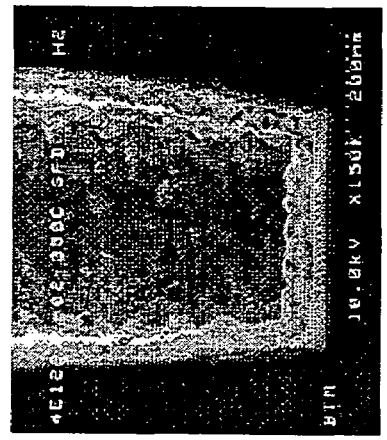
FIGS. 12A–12D are diagrams showing the state of step coverage of a via-hole surface by a barrier metal film and a tungsten nucleation layer for the case the process condition for formation of the tungsten nucleation layer by ALD process is changed variously.
Figure 12D:
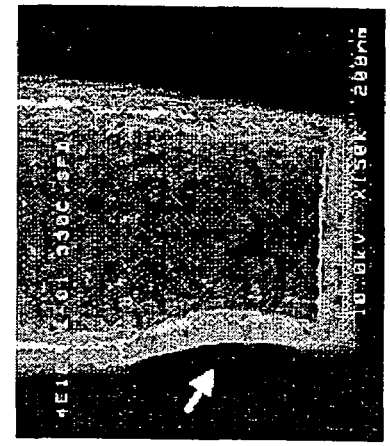
Figure 12A:
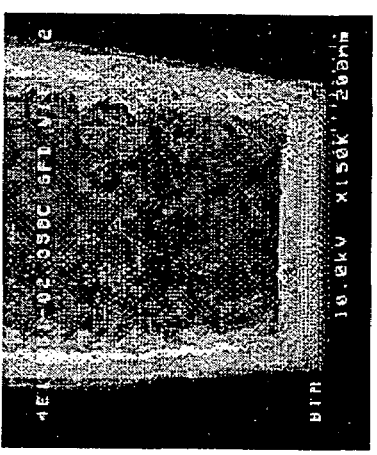

FIGS. 12A and 12B show the step coverage for the case the tungsten nucleation layer 23W1 is formed on the inner wall of the via-holes respectively having the aspect ratios of 1.38 and 1.55 by the ALD process of the present embodiment with a film thickness of 8 nm. In any of FIGS. 12A and 12B, it should be noted that the barrier metal film 22A is formed of a TaN film and no Ta film is formed.

Referring to FIGS. 12A and 12B, the bright tungsten nucleation layer 23W1 is adhered to the TiN film intimately and it is confirmed that there is formed no defects such as cavity.

Figure 12C:
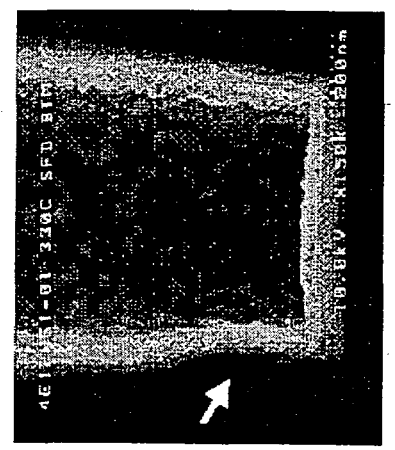

On the other hand, FIGS. 12C and 12D show the case in which the supply of the hydrogen gas at the time of formation of the tungsten nucleation layer 23W1 by the ALD process is omitted, in other words, the result for the case in which the tungsten nucleation layer 23W1 is formed on a sidewall surface of a minute via-hole sidewall by using a conventional ALD process applied conventionally to the via-holes of small aspect ratio. Here, it should be noted that FIG. 12C represents the case in which the aspect ratio of the via-hole 22V (via-diameter of 0.65 μm)is 1.38, while FIG. 12D shows the case in which the aspect ratio of the via-hole 22V (via-diameter 0.58 μm) is 1.55. In any of the cases of FIGS. 15C and 15D, the barrier metal film 22A is formed of the TaN film that does not contain a Ta film.

Referring to FIGS. 12C and 12D, it can be seen that there is formed a cavity or defect in any of these cases between the sidewall surface of the via-hole and the tungsten nucleation layer 23W1 as represented with an arrow.

It should be noted that the defect shown in FIGS. 12C and 12D is the one formed conventionally when the aspect ratio of the via-hole 22V has become 1.25 or more. Thus, it has not been possible to fill such a minute via-hole by a tungsten plug without causing defect.

In the present embodiment, it becomes possible to fill the via-hole by the tungsten plug without causing defect even if the aspect ratio of the via-hole becomes 1.25 or more by forming the barrier metal film 22A by a metal film or a TaN film not containing a metal film or a metal layer and by forming the tungsten films 22W1 and 22W while supplying the hydrogen gas. Particularly, it is confirmed that the via-hole having the aspect ratio of 3.0 can be filled by a tungsten plug without causing defect, by increasing the flow rate of the hydrogen gas to 1200 SCCM in the ALD process of FIG. 11.

Thus, the present invention is a technology generally needed when filling a minute via-hole with the tungsten plug. The present invention is especially effective in the case the interconnection pattern underneath the tungsten plug is a copper interconnection pattern, which is easily eroded by a fluoride source material such as $WF_6$.

FIG. 13A is a histogram showing the distribution of chain resistance for the case in which a large number of via-contacts are formed on a silicon wafer by the method of the first and second embodiments. FIG. 13B, on the other hand, shows the distribution of the chain resistance of the via-contacts formed with the conventional process, in other words, the process in which the stacked structure of a TaN film and a Ta film is used for the barrier metal film and the tungsten plug is formed without supplying the hydrogen gas.

Referring to FIGS. 13A and 13B, it can be seen that the chain resistance of the via-plug is reduced substantially by the present invention and that the defective contacts formed with a proportion of about 35% in the conventional process has been reduced to zero. Conventionally, it should be noted that defective via-plugs having a very high chain resistance such as the one seen in FIG. 13B are formed along the circumferential part of the wafer.

Thus, according to the present invention, it becomes possible to realize a yield of 100% at the time of formation of the tungsten via-contact.

In the present embodiment, the TiN film 22B is formed on the TaN barrier metal film 22A as the foundation of the tungsten film formation. Because the barrier metal film 22A is formed of a nitride film not reacting with fluoride, it is possible to eliminate the TiN film 22B in the present embodiment. In this case, the tungsten film 23W or 23W1 is formed directly on the metal film 22A. Also it is possible in the present embodiment to form the entire barrier metal film 22 by the TiN film 22B.

Although the present embodiment supplies the hydrogen gas to surface of the substrate at the time of deposition of the tungsten film 23W1 or 23W, it is also possible to process the surface of the structure of FIG. 8C with plasma containing hydrogen before the deposition of the tungsten film.

Figure 14:
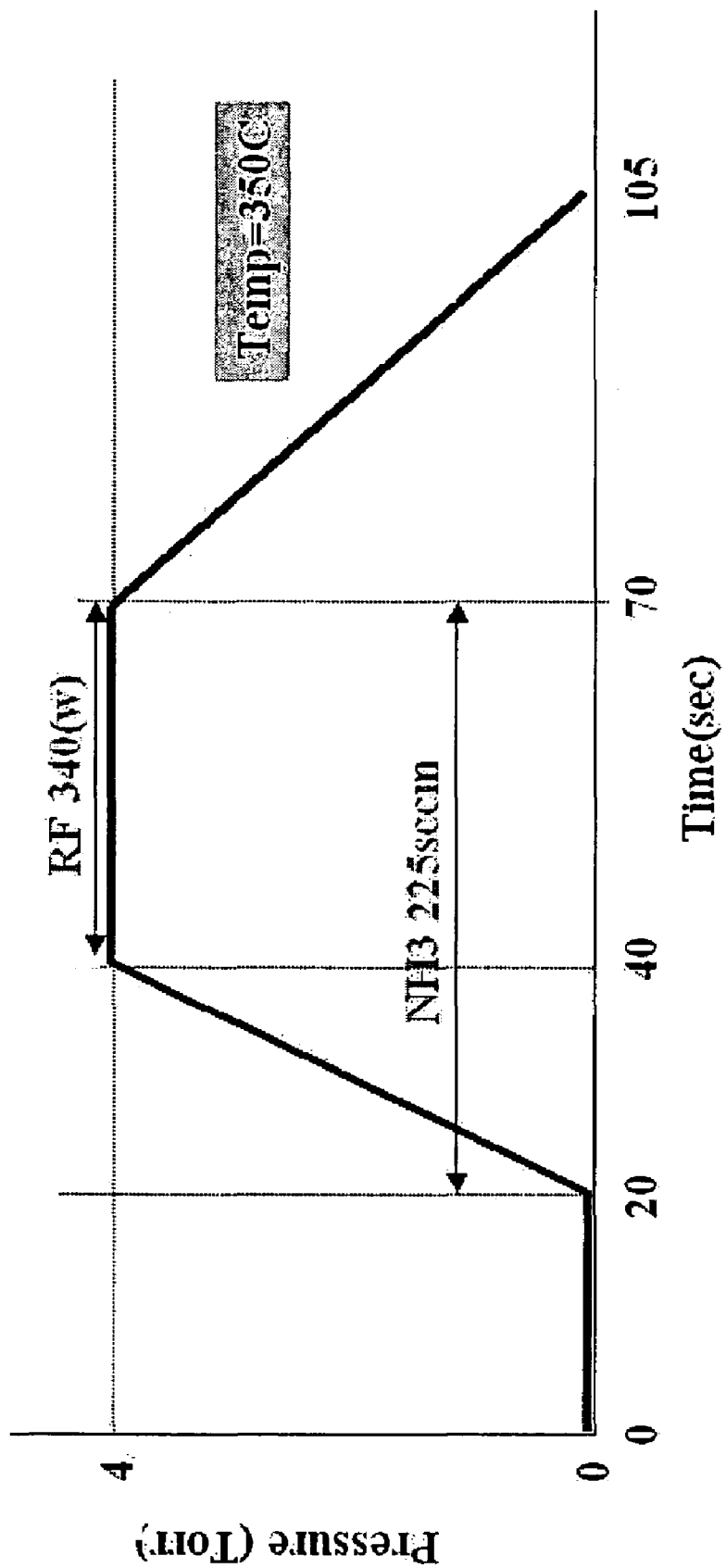
FIG. 14 is a diagram showing the recipe of pre-processing plasma process according to a modification of the second embodiment of the present invention conducted prior to the tungsten film deposition.

FIG. 14 shows the example of plasma processing conducted to the structure of FIG. 5C before the formation of the tungsten nucleation layer 23W1.

Referring to FIG. 14, the structure of FIG. 5C is introduced into the processing vessel of the plasma CVD device in this embodiment and the substrate temperature is set to 350° C. Further, NH$_3$ is introduced with a flow rate of 225 SCCM as the processing gas, and the pressure inside the processing vessel is set to about 530 Pa (4 Torr). By supplying a high frequency power of 340 W in this state, plasma is excited and the surface of the TiN film 22B is processed with the NH$_3$ plasma for about 30 seconds.

With such a surface treatment, too, it is possible to suppress the occurrence of the defects in between the via-hole and tungsten plug explained previously.

THIRD EMBODIMENT

FIG. 15 shows the method of forming a multilayer interconnection structure according to a third embodiment of the present invention that uses a cluster type substrate processing apparatus 200.

Referring to FIG. 15, the cluster-type substrate processing apparatus 200 includes a vacuum transportation chamber 201 to which a load-lock chamber 200A, a sputtering chamber 200B, which in turn accommodates therein a reactive sputtering apparatus 100 equipped with a Ta target 104 and conducting deposition of TaN as explained previously with reference to FIG. 6, a sputtering chamber 200C, which in turn accommodates therein a reactive sputtering apparatus conducting deposition of the TiN film, and a CVD chamber 200D for conducting deposition of the tungsten film 23W1 or 23W are connected.

Thus, the substrate of the state of FIG. 5A is introduced into the load-lock chamber 200A, and deposition of the TaN film 22A is conducted by the recipe explained previously with reference to FIG. 7B.

In the recipe of FIG. 7B, the cleaning of the Ta target 104 is conducted after the deposition of the TaN film 22A. Thus, in the present embodiment, the substrate to be processed is forwarded to processing chamber 200 C immediately after the deposition of the TaN film 22A from the processing chamber 200B, and deposition of the TiN film 22B is conducted. Thus, the deposition of the TiN film 22B is conducted simultaneously to the cleaning process of the Ta target 104.

Further, the substrate in the state of FIG. 5C and finished with the deposition process of the TiN film 22B in the processing chamber 200C is sent to the CVD chamber 200D for deposition of the tungsten nucleation layer 23W1 and the tungsten film 23W. Of course, it is possible in the cluster type processing apparatus 200 of FIG. 15 to conduct the formation of the tungsten nucleation layer 23W1 by the ALD process and the formation of the tungsten film 23W conducted by a usual CVD process in different processing chambers.

As a result of use of the cluster-type substrate processing apparatus 200 of FIG. 15, the substrate is sent to the next processing chamber 200C at the time of the cleaning of the Ta target 104 in the processing chamber 200B, and contamination of the substrate in the cleaning process is eliminated. Also, the process throughput can be improved.

FOURTH EMBODIMENT

Next, the fabrication process of the semiconductor device according to a fourth embodiment of the present invention, in which the multilayer interconnection structure of the present invention formed by a dual damascene process is provided on a multilayer interconnection structure having a copper interconnection pattern will be explained with reference to FIGS. 16A–16L.

Figure 16A:
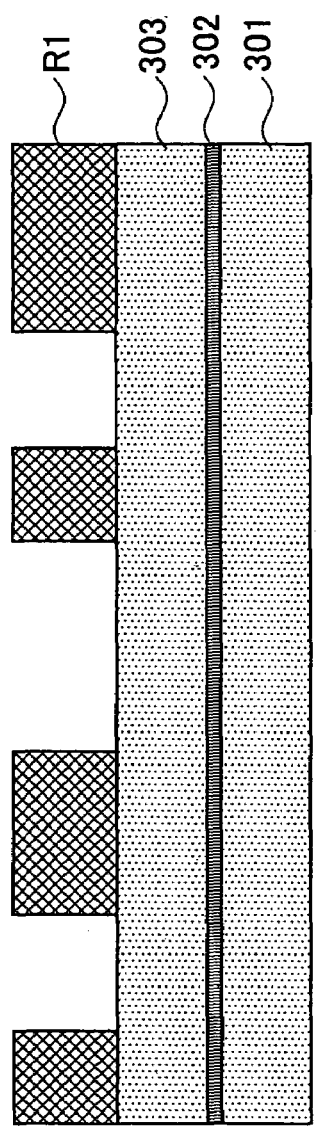
FIGS. 16A–16L are diagrams showing the fabrication process of a semiconductor device according to a fourth embodiment of the present invention.

Referring to FIG. 16A, an interlayer insulation film 303 formed of SiO$_2$, and the like, is formed on an insulation film 301 on a silicon substrate (not shown) via an SiN film 302, and a resist pattern R1 corresponding to a desired interconnection pattern is formed on the interlayer insulation film 303.

Figure 16B:
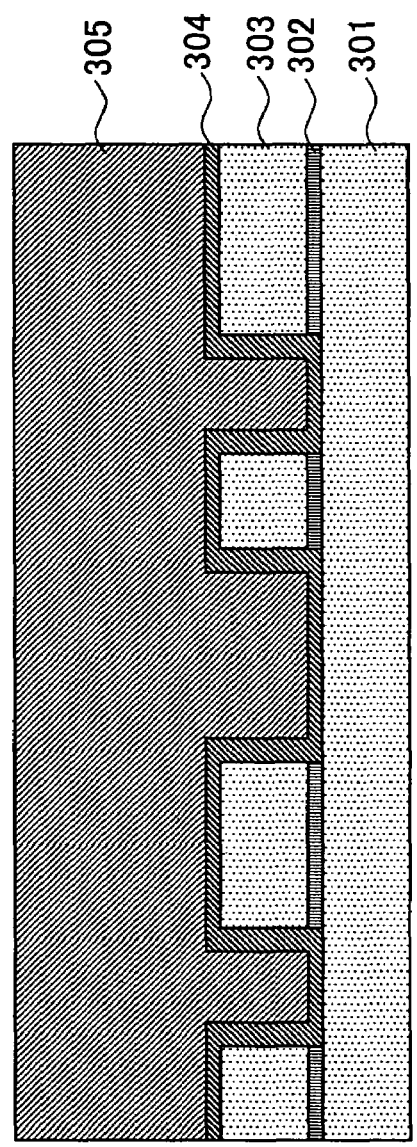

Next, in the step of FIG. 16B, the interlayer insulation film 303 is patterned by using the resist pattern R1 as a mask, and a wiring groove corresponding to the desired interconnection pattern is formed in the interlayer insulation film 303. Further, the interlayer insulation film 303 thus patterned is covered with a Ta barrier metal film 304 and a copper layer 305 is formed so as to fill the wiring groove by an electrolytic plating process, and the like.

Figure 16C:
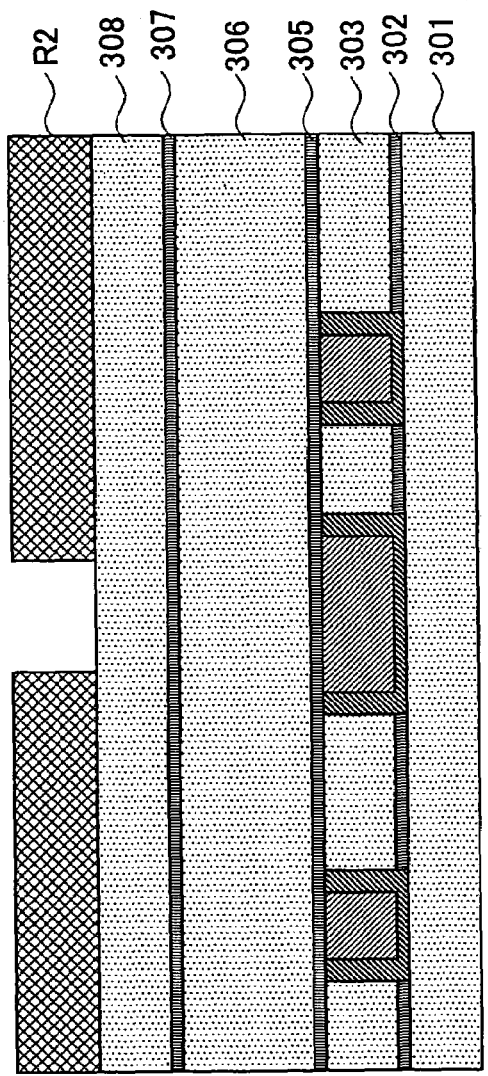

Further, in the process of FIG. 16C, the copper layer 305 and the barrier metal film 304 underneath are polished away by a CMP process until the surface of the interlayer insulation film 303 is exposed. Further, a next interlayer insulation film 306 of SiO$_2$, and the like, is formed on the structure thus formed via an SiN barrier film 305.

In the step of FIG. 16C, a next interlayer insulation film 308 formed of SiO$_2$, and the like, is formed and on the interlayer insulation film 306 via an SiN barrier film 307, and a resist pattern R2 corresponding to a desired contact hole is formed in the interlayer insulation film 308.

Figure 16D:
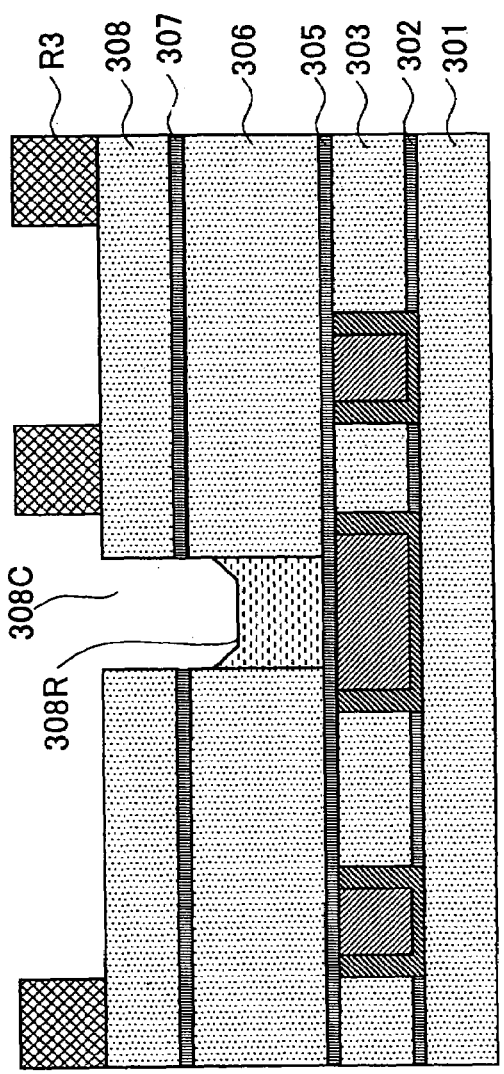

Next, in the step of FIG. 16D, the interlayer insulation film 308, the barrier film 307 and also the interlayer insulation film 306 are patterned consecutively while using the resist pattern R2 as a mask, and a contact hole 308C is formed so as to expose the SiN barrier film 305 at the bottom part of the contact hole 308C. Further, by applying a non-photosensitive resin film, the contact hole 308C is fill with the resin film. Further, by dissolving the resin film on the interlayer insulation film 308, a resin protection part 308R is left in the contact hole 308C.

Further, in the step of FIG. 16D, a resist pattern R3 is formed on the interlayer insulation film 308 in correspondence to the wiring groove to be formed in the interlayer insulation film 308.

Figure 16E:
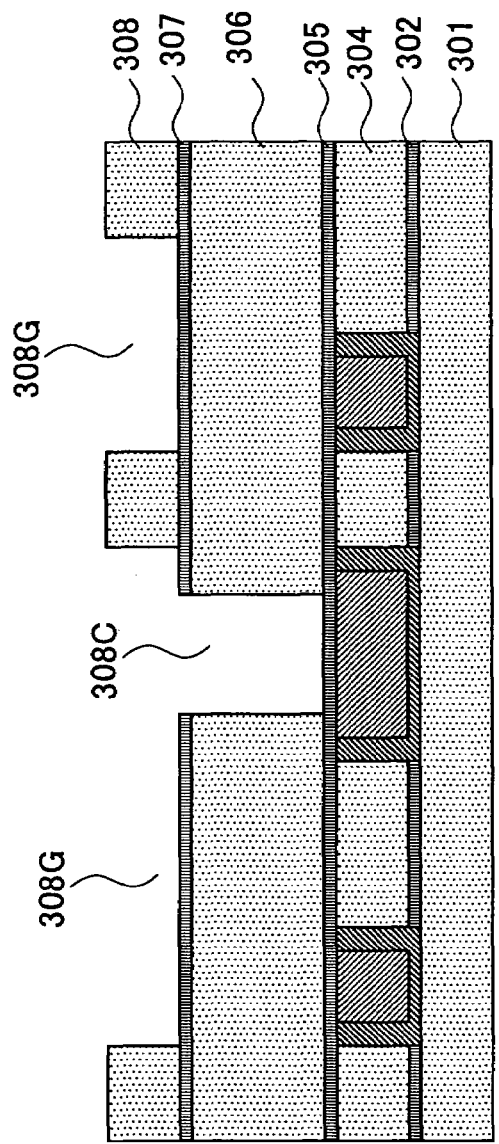

Next, in the step of FIG. 16E, the interlayer insulation film 308 is patterned in the state the inner wall surface of the contact hole 308C is protected by the resin protection part 308R until the SiN barrier film 307 is exposed while using the resist pattern R3 as a mask, and a desired wiring groove 308G is formed in the interlayer insulation film 308.

Further, the resin protection part 308R is removed in the step of FIG. 16E by an ashing process after the patterning of the interlayer insulation film 308.

Figure 16F:
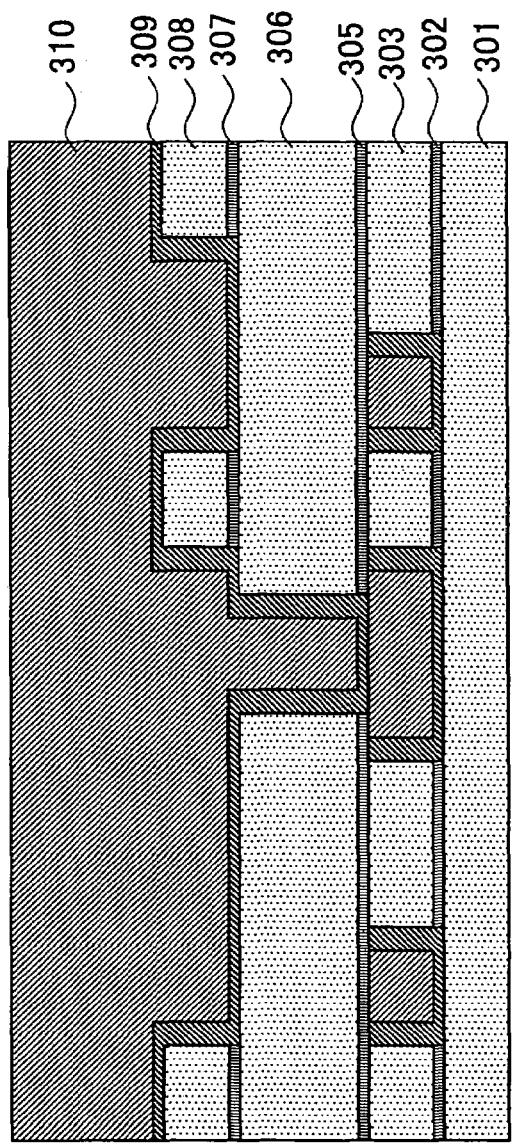

Further, in the step of FIG. 16F, the interlayer insulation film 308 is used as a self-aligned mask and the SiN barrier films 307 and 305 are removed respectively from the bottom of the wiring groove 308G and also from the bottom of the contact hole 308C. Further, the surface of the structure thus obtained is covered with a Ta barrier metal film 309, and a copper layer 310 is formed by an electrolytic plating process, and the like, so as to fill the mentioned contact hole 308C and the groove 308G.

Figure 16G:
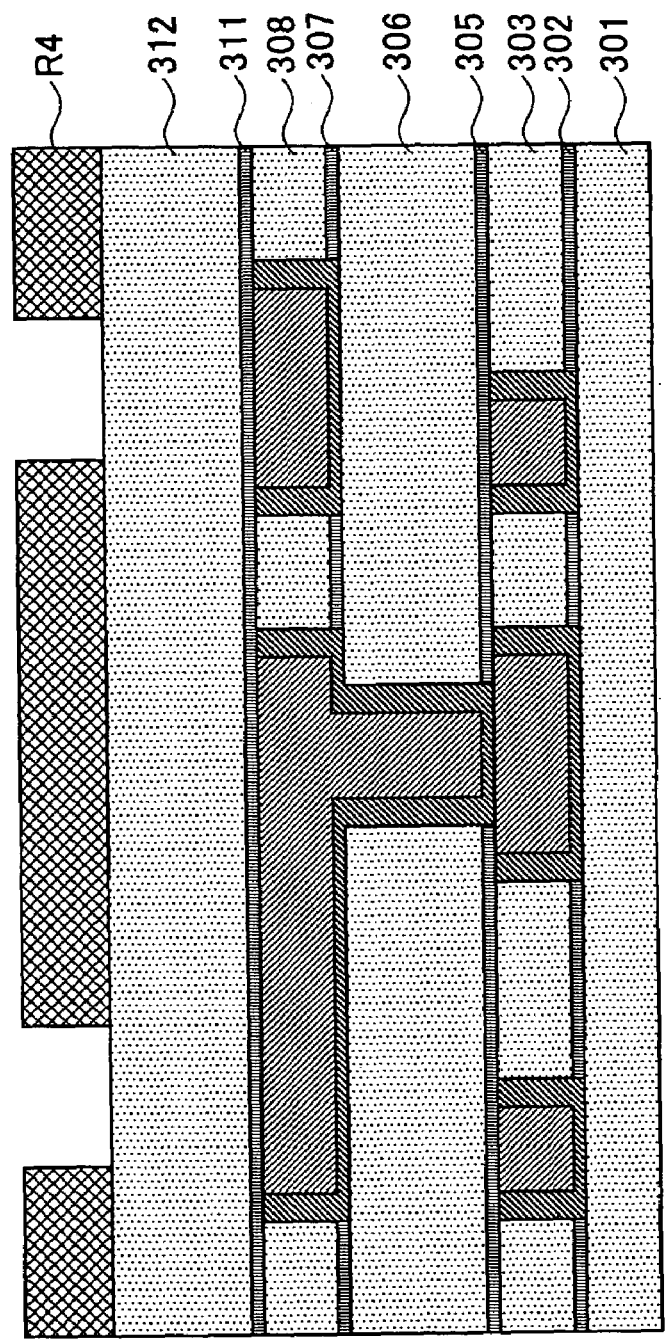

Next, in the step of FIG. 16G, the copper layer 310 of FIG. 16G and also the Ta barrier metal film 309 underneath are removed by a CMP process until the surface of the interlayer insulation film 308 is exposed, and an SiN barrier film 311 and an interlayer insulation film 312 of SiO$_2$, and the like, are formed on the structure thus obtained.

Further, in the step of FIG. 16G, a resist pattern R4 corresponding to the via-hole to be formed in the interlayer insulation film 312 is formed on the interlayer insulation film 312.

Figure 16H:
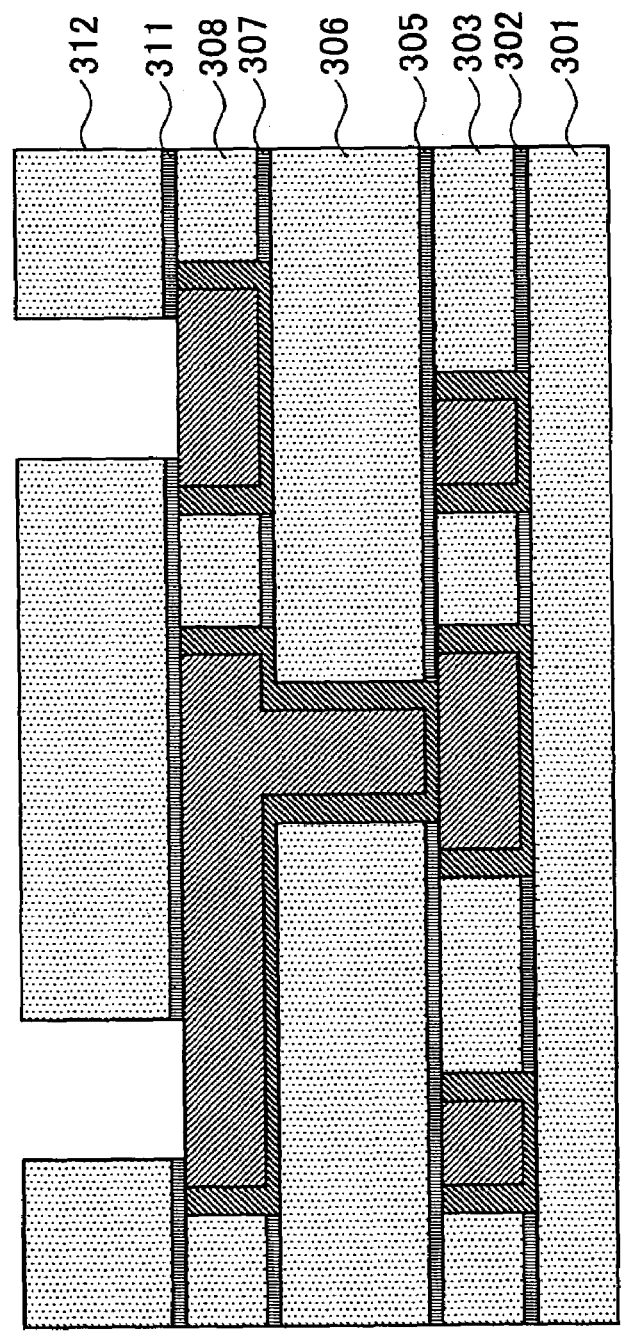

Further, in the step of FIG. 16H, the interlayer insulation film 312 and the SiN barrier film 311 underneath are patterned while using the resist pattern R4 as a mask, and a desired via-hole 312V is formed in the interlayer insulation film 312.

In the present embodiment, the structure of FIG. 16H thus formed with the via-hole 312V is introduced into the processing chamber 101 of the reactive sputtering apparatus 100 explained previously with reference to FIG. 6. Thereby, as explained with the previous embodiment, the barrier metal layer 313 of the TaN film not containing a metallic Ta film is formed on the interlayer insulation film 312 so as to cover the sidewall surface and also the bottom surface of the via-hole 312V continuously.

Figure 16I:
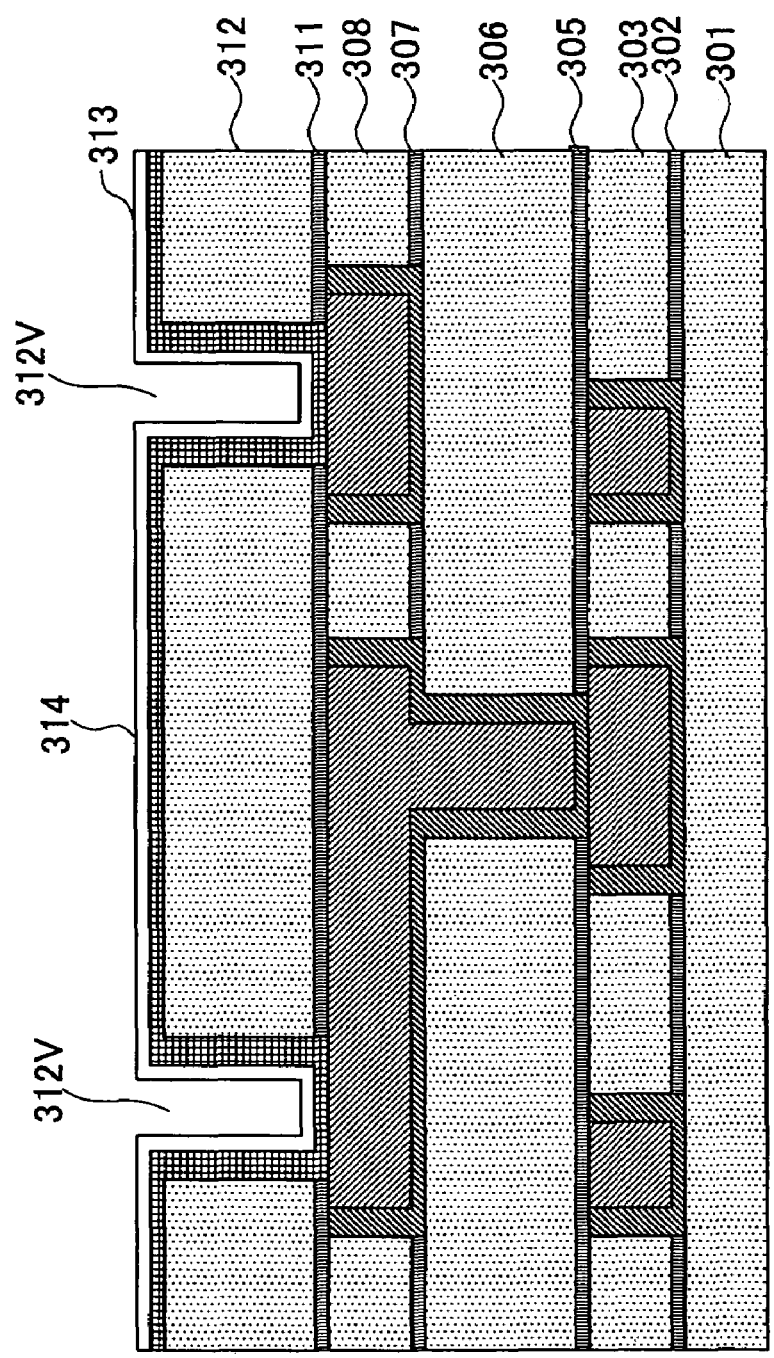
Figure 16J:
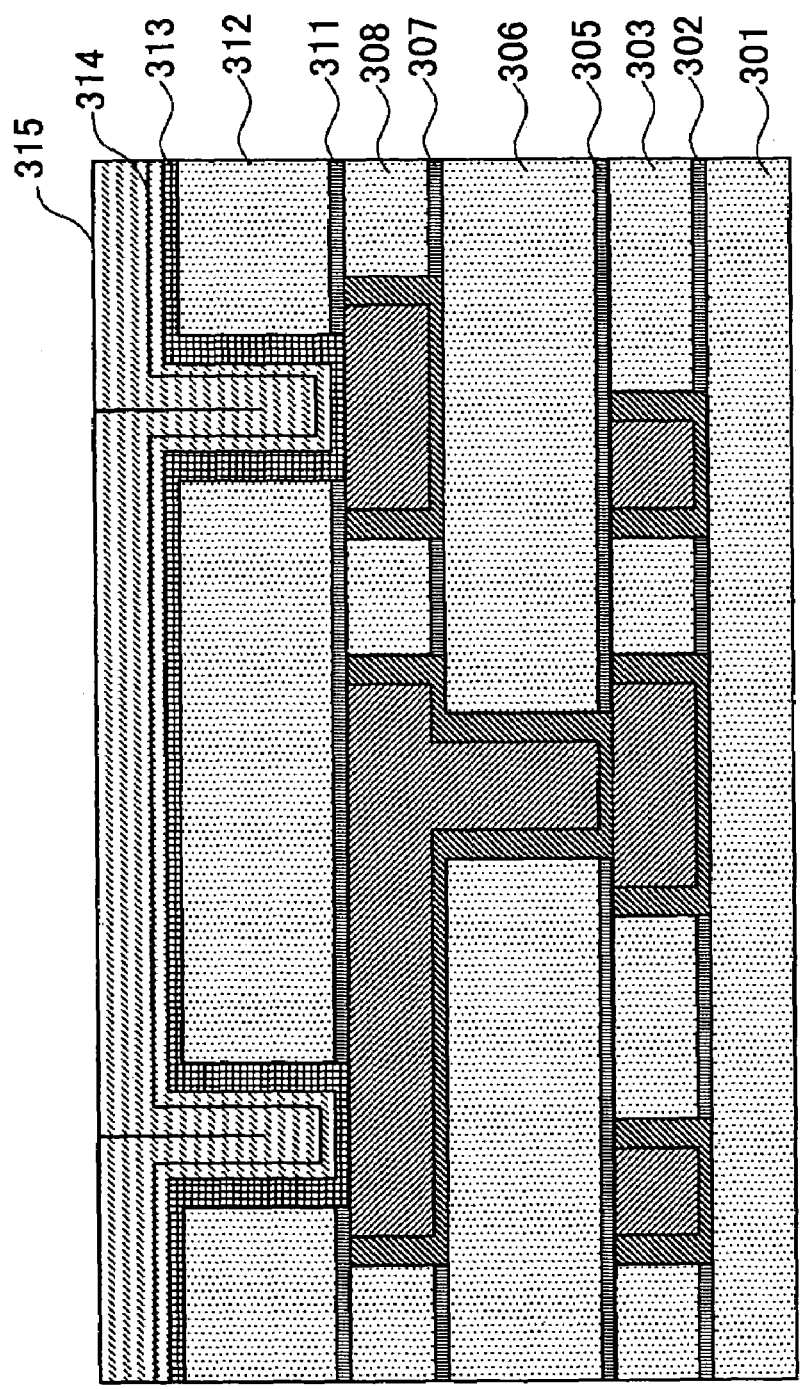

Further, in the step of FIG. 16I, a TiN barrier metal film 314 is formed on the TaN barrier metal film 313 also by a reactive sputtering, and in the step of FIG. 16J, the tungsten film 315 is formed on the structure of FIG. 16I by a CVD process such that the tungsten film 315 fills the via-hole 312V. In the step of FIG. 16J, the tungsten film 315 is preferably deposited by first forming a thin tungsten nucleation layer 315a by an ALD process explained previously and then depositing the tungsten film 315 by a usual CVD process.

Figure 16K:
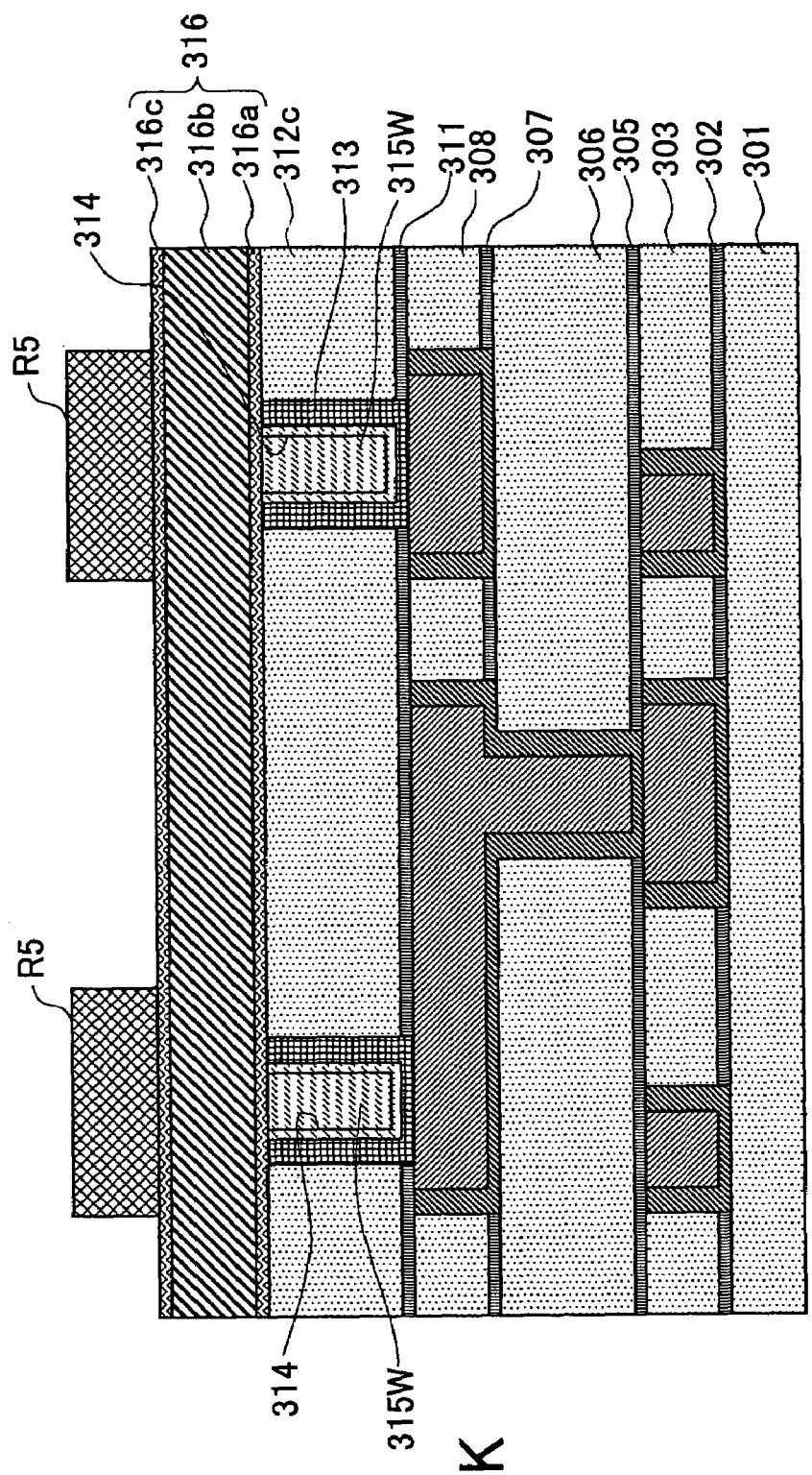

Next, in the step of FIG. 16K, the tungsten film 315 and the TiN film 314 and also the TaN film 313 underneath the tungsten film 315 are polished away by a CMP process until the surface of the interlayer insulation film 312 is exposed. With this, a tungsten via-plug 315W is formed in the via-hole 312V.

Further, in the step of FIG. 16K, a conductor film 316b of the aluminum or aluminum-copper alloy is formed on the interlayer insulation film 312 via a TiN barrier metal film 316a, and another TiN barrier metal film 316c is formed on the conductor film 316b, wherein the TiN barrier metal films 316a and 316c form an interconnection layer 316.

Figure 16L:
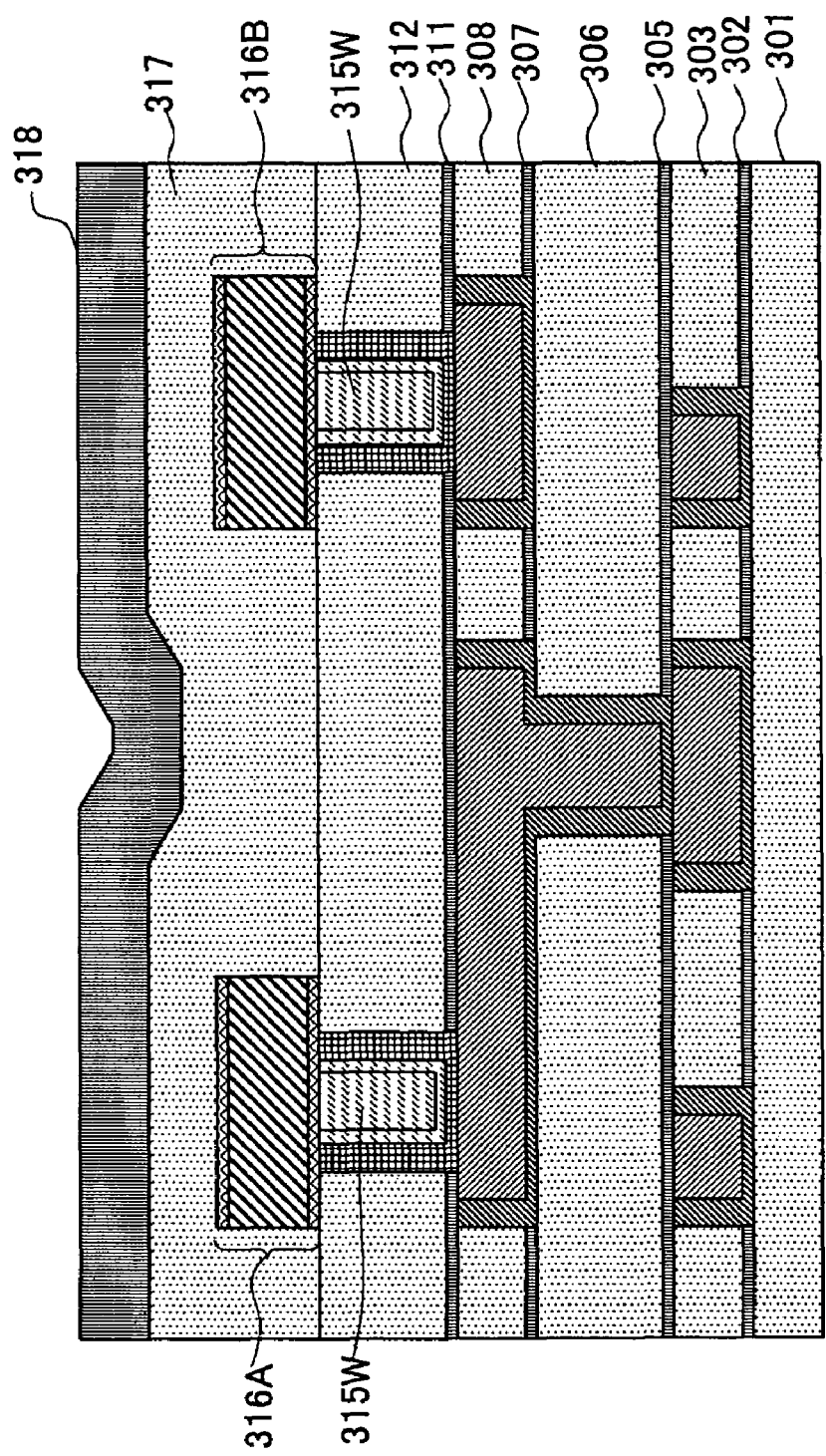

In the state of FIG. 16K, the resist pattern R5 corresponding to the interconnection pattern to be formed is formed on the interconnection layer 316, and in the step of FIG. 16L, the interconnection layer 316 is patterned by a dry etching process, and the like, while using the resist pattern R5 as a mask, and interconnection patterns 316A and 316B are formed on the tungsten plug 315W.

Further, in the step of FIG. 16K, an interlayer insulation film 317 such as SiO2 is deposited on the interlayer insulation film 312 so as to cover the interconnection patterns 316A and 316B, and a passivation film 318 such as SiN is formed on the surface of the interlayer insulation film 317.

In the present embodiment, too, formation of a Ta metal film is suppressed on the surface of the TaN barrier metal film 313 when forming the TaN barrier metal film 313 in the step of FIG. 16I by evacuating the substrate out of the reactive sputtering apparatus 100 such as forwarding the substrate to a next process during the target cleaning process. Thereby, occurrence of the defects in the barrier metal film 313 is successfully suppressed.

Further, in the step of depositing the tungsten film 315 of FIG. 16J, especially in the step of depositing the nucleation layer 315a on the surface of the TiN barrier metal film 314 by using an ALD process, it becomes possible to suppress the corrosion of the copper interconnection pattern contacting with the tungsten plug 315W, by supplying the hydrogen gas on the surface of the substrate to be processed.

FIFTH EMBODIMENT

Figure 17:
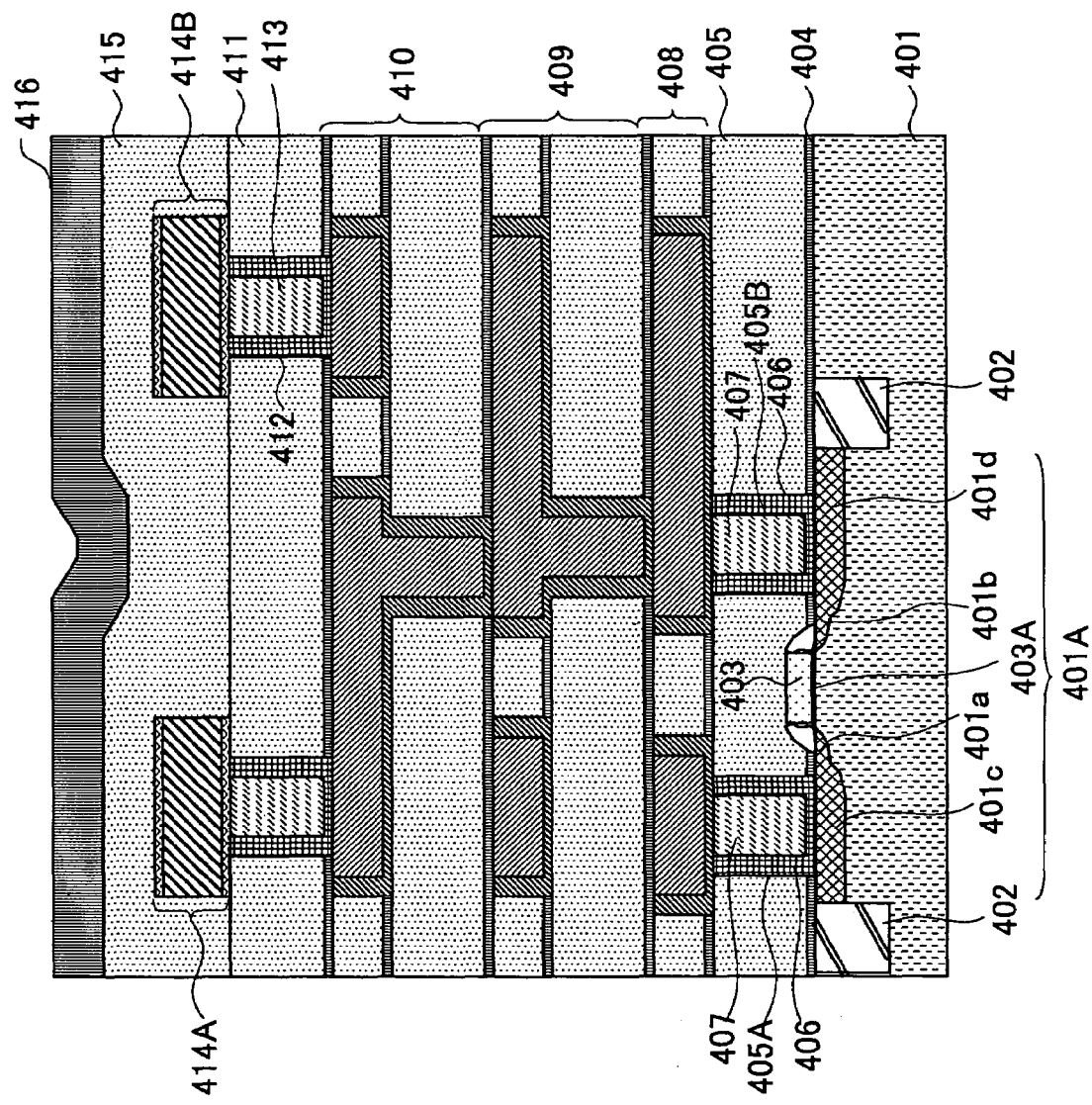
FIG. 17 is a diagram showing the construction of a semiconductor device according to a fifth embodiment of the present invention.

FIG. 17 is a diagram showing the construction of a semiconductor device having a multilayer interconnection structure thus formed according to a fifth embodiment of the present invention.

Referring to FIG. 17, a device region 401A is defined on a silicon substrate 401 by an STI (shallow trench isolation) structure 402, and a gate electrode 403 is formed on the silicon substrate 401 in the device region 401A via a gate insulation film 403A.

On the both sidewall surfaces of the gate electrode 403, there is formed a sidewall insulation film, and LDD (lightly doped drain) regions 401a and 401b are formed in the silicon substrate 401 at both lateral sides of the gate electrode 403. Further, diffusion regions 401c and 401d forming the source region or the drain region are formed in the silicon substrate 401 at outer sides of the sidewall insulation film. Further, the surface of the silicon substrate 401 is covered uniformly by an SiN film 404 except for the part where the gate electrode 403 and the sidewall insulation film are formed.

On the SiN film 404, an interlayer insulation film 405 of SiO$_2$, and the like, is formed so as to cover the gate electrode 403 and also the sidewall insulation film, and contact holes 405A and 405B exposing the diffusion regions 401c and 401d are formed in the interlayer insulation film 405.

The sidewall surface and also the bottom surface of the contact holes 405A and 405B are covered by a barrier metal film 406 in which a TaN film and a TiN film are stacked, and the contact holes 405A and 405B are filled with a tungsten plug 407 through the barrier metal film.

On the interlayer insulation film 405, copper wiring structures 408, 409 and 410, in which a copper interconnection pattern is buried in an interlayer insulation film, are formed consecutively by a damascene process or a dual damascene process explained previously with reference to the embodiments. On the copper wiring structure 410, a conductive plug 413 of tungsten is formed in an interlayer insulation film 411 in a via-hole having a sidewall surface and a bottom surface covered continuously with a barrier metal film 412 of a conductive nitride in which a TaN film and a TiN film are that stacked.

Further, interconnection patterns 414A and 414B having a construction of sandwiching a conductor film of aluminum or aluminum base alloy with a pair of TiN barrier metal films are formed on the interlayer insulation film 411, and an interlayer insulation film 415 is formed on the interlayer insulation film 411 so as to cover the interconnection patterns 414A and 414B.

Further, the surface of the interlayer insulation film 415 is covered by a passivation film 416 of SiN, and the like.

In the present embodiment, it becomes possible to effectively suppress the occurrence of defects, which tend to be caused in the barrier metal film when filling the via-hole with a tungsten film, by forming the barrier metal film 406 or 412 by a nitride film not containing a metal film or a metal part substantially.

In the present embodiment, too, it becomes possible to suppress the corrosion of the copper interconnection pattern underneath the tungsten plug or the corrosion of the barrier metal film when forming the tungsten plug 407 or the tungsten plug 413, by supplying a hydrogen gas simultaneously at least in the process of forming the nucleation layer part by an ALD process, and the like.

In the foregoing, explanation was made for the example of using the barrier metal film containing Ta as a constituent element. However, the present invention is not limited to such a case of using Ta but is applicable also to the case of forming a tungsten plug while using a barrier metal film containing other metallic element such as Ti as the constituent element. Even in such a case, it is preferable to form the barrier metal film by using nitride film only when the aspect ratio of the via-hole is increased. While the present invention has been explained for the case in which the conductor pattern provided underneath the tungsten plug is a copper interconnection pattern, the present invention is effective also in the case the conductor pattern is formed of other interconnection patterns such as Al, and the like.

Further, the present invention is not limited to the preferred embodiments described heretofore, but various variations and modifications may be made without departing from the scope of the invention.

What is claimed is:

1. A multilayer interconnection structure, comprising:
   a first interconnection layer including a copper interconnection pattern, said copper interconnection pattern having a top principal surface coincident to a top principal surface of said first interconnection layer and filling a hole formed in said first interconnection layer;
   an interlayer insulation film formed on said first interconnection layer;
   a second interconnection layer formed on said interlayer insulation film;
   a via-hole formed in said interlayer insulation film so as to expose said copper interconnection pattern; and
   a tungsten plug formed in said via-hole and said hole so as to connect said first interconnection layer and said second interconnection layer electrically,
   said via-hole having a depth/diameter ratio of 1.25–3.0,
   wherein there is formed a conductive nitride film between an outer wall of said tungsten plug and an inner wall of said via-hole such that said conductive nitride film is defined by an inner wall contacting with said outer wall of said tungsten plug and an outer wall contacting with said inner wall of said via-hole,
   said conductive nitride film being formed of a first nitride film and a second nitride film stacked inside said first nitride film, said first nitride film having an outer surface and an inner surface, said outer surface of said first nitride film being in intimate contact with said inner wall of said via-hole, said second nitride film having an outer surface and an inner surface, said outer surface of said second nitride film being in intimate contact with said inner surface of said first nitride film, said inner surface of said second nitride film being in intimate contact with said outer surface of said tungsten plug.

2. The multilayer interconnection structure as claimed in claim 1, wherein said first nitride film is formed of a TaN film and said second nitride film is formed of a TiN film.

3. The multilayer interconnection structure as claimed in claim 1, wherein said nitride film has a composition with characteristics of being corrosion resistant to a fluoride gaseous source of tungsten, said fluoride gaseous source of tungsten forming said tungsten plug.

4. The multilayer interconnection structure as claimed in claim 1, wherein said second interconnection layer contains an aluminum interconnection pattern.

5. A semiconductor device, comprising:
   a substrate; and
   a multilayer interconnection structure formed on said substrate,
   said multilayer interconnection structure comprising:
   a first interconnection layer including a copper interconnection pattern, said copper interconnection pattern having a top principal surface coincident to a top principal surface of said first interconnection layer and filling a hole formed in said first interconnection layer;
   an interlayer insulation film formed on said first interconnection layer;
   a second interconnection layer formed on said interlayer insulation film;
   a via-hole formed in said interlayer insulation film so as to expose said copper interconnection pattern; and
   a tungsten plug formed in said via-hole and said hole so as to connect said first interconnection layer and said second interconnection layer electrically,
   said via-hole having a depth/diameter ratio of 1.25–3.0,
   wherein there is formed a conductive nitride film between an outer wall of said tungsten plug and an inner wall of said via-hole such that said conductive nitride film is defined by an inner wall contacting with said outer wall of said tungsten plug and an outer wall contacting with said inner wall of said via-hole,
   said conductive nitride film being formed of a first nitride film and a second nitride film stacked inside said first nitride film, said first nitride film having an outer surface and an inner surface, said outer surface of said first nitride film being in intimate contact with said inner wall of said via-hole, said second nitride film having an outer surface and an inner surface, said outer surface of said second nitride film being in intimate contact with said inner surface of said first nitride film, said inner surface of said second nitride film being in intimate contact with said outer surface of said tungsten plug.

* * * * *